United States Patent
Jeong et al.

(10) Patent No.: US 10,547,000 B2
(45) Date of Patent: Jan. 28, 2020

(54) VARIABLE RESISTANCE MEMORY DEVICE AND METHOD OF MANUFACTURING THE SAME

(71) Applicant: Samsung Electronics Co., Ltd., Suwon-si (KR)

(72) Inventors: Ji-Hyun Jeong, Hwaseong-si (KR); Ilmok Park, Seoul (KR); Si-Ho Song, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 27 days.

(21) Appl. No.: 16/014,871

(22) Filed: Jun. 21, 2018

(65) Prior Publication Data

US 2019/0123272 A1    Apr. 25, 2019

(30) Foreign Application Priority Data

Oct. 20, 2017    (KR) .................. 10-2017-0136297

(51) Int. Cl.
*G11C 11/00* (2006.01)
*H01L 45/00* (2006.01)
*G11C 13/00* (2006.01)

(52) U.S. Cl.
CPC ........ *H01L 45/126* (2013.01); *G11C 13/0004* (2013.01); *H01L 45/06* (2013.01); *H01L 45/141* (2013.01); *H01L 45/145* (2013.01); *H01L 45/1675* (2013.01)

(58) Field of Classification Search
CPC ..... H01L 45/126; H01L 45/06; H01L 45/141; G11C 13/0004

USPC ......................................................... 365/148
See application file for complete search history.

(56) References Cited

U.S. PATENT DOCUMENTS

| | | | |
|---|---|---|---|
| 7,718,988 | B2 | 5/2010 | Lee |
| 8,049,201 | B2 | 11/2011 | Jeong |
| 9,337,421 | B2 | 5/2016 | Chin et al. |
| 9,419,212 | B2 | 8/2016 | Petz et al. |
| 9,543,515 | B2 | 1/2017 | Gealy et al. |
| 2008/0210923 | A1 | 9/2008 | Sato |

(Continued)

FOREIGN PATENT DOCUMENTS

| | | |
|---|---|---|
| JP | 2008-053494 A | 3/2008 |
| JP | 5688196 B2 | 3/2015 |

(Continued)

*Primary Examiner* — Vu A Le
(74) *Attorney, Agent, or Firm* — Muir Patent Law, PLLC

(57) ABSTRACT

Disclosed are a variable resistance memory device and a method of manufacturing the same. The device comprises a first conductive line extending in a first direction, a second conductive line extending in a second direction intersecting the first direction, a memory cell at an intersection between the first conductive line and the second conductive line, a first electrode between the first conductive line and the memory cell, and a second electrode between the second conductive line and the memory cell. The memory cell comprises a switching pattern, an intermediate electrode, a first resistivity control pattern, and a variable resistance pattern that are connected in series between the first conductive line and the second conductive line. Resistivity of the first resistivity control pattern is less than resistivity of the second electrode.

20 Claims, 22 Drawing Sheets

(56) References Cited

U.S. PATENT DOCUMENTS

| | | | |
|---|---|---|---|
| 2009/0020745 A1* | 1/2009 | Jeong | G11C 13/003 |
| | | | 257/4 |
| 2009/0140233 A1 | 6/2009 | Kinoshita et al. | |
| 2012/0043518 A1* | 2/2012 | Cheng | C23C 16/26 |
| | | | 257/4 |
| 2017/0250222 A1* | 8/2017 | Wu | H01L 45/06 |
| 2019/0088871 A1* | 3/2019 | Kim | H01L 45/1233 |

FOREIGN PATENT DOCUMENTS

| JP | 2015-201519 A | 11/2015 |
|---|---|---|
| KR | 10-0855975 B1 | 9/2008 |
| KR | 10-2009-0049028 A | 5/2009 |

\* cited by examiner

VARIABLE RESISTANCE MEMORY DEVICE AND METHOD OF MANUFACTURING THE SAME

CROSS-REFERENCE TO RELATED APPLICATIONS

This U.S. nonprovisional patent application claims the benefit of priority under 35 U.S.C. § 119 of Korean Patent Application No. 10-2017-0136297, filed on Oct. 20, 2017, in the Korean Intellectual Property Office, the entire contents of which are hereby incorporated by reference.

BACKGROUND

The disclosure relates to a variable resistance memory device and a method of manufacturing the same.

Semiconductor devices may be classified into memory devices, which store data, and logic devices. In general, semiconductor memory devices may be broadly classified into volatile memory devices and nonvolatile memory devices. Volatile memory devices lose data stored therein when power supply is interrupted, and nonvolatile memory devices retain data stored therein even when power supply is interrupted.

Next generation semiconductor memory devices, for example, ferroelectric random access memory (FRAM), magnetic random access memory (MRAM) and phase change random access memory (PRAM), are being developed to meet the trend of high performance and low power of the semiconductor memory device. The next generation semiconductor memory devices include a material having characteristics where their resistance changes depending on applied electric current or voltage and their changed resistance is maintained even when their electric current or voltage supply is interrupted.

SUMMARY

Some embodiments provide a variable resistance memory device having enhanced reliability and a method of manufacturing the same.

Some embodiments provide a variable resistance memory device having enhanced electrical characteristics and a method of manufacturing the same.

Objectives of inventive concepts are not limited to those mentioned above, and other objectives which have not been mentioned above will be clearly understood to a person skilled in the art from the following description.

According to exemplary embodiments, the disclosure is directed to a variable resistance memory device, comprising: a first conductive line extending in a first direction; a second conductive line extending in a second direction intersecting the first direction; a memory cell at an intersection between the first conductive line and the second conductive line; a first electrode between the first conductive line and the memory cell; and a second electrode between the second conductive line and the memory cell, wherein the memory cell comprises a switching pattern, an intermediate electrode, a first resistivity control pattern, and a variable resistance pattern that are connected in series between the first conductive line and the second conductive line, and wherein a resistivity of the first resistivity control pattern is less than a resistivity of the second electrode.

According to exemplary embodiments, the disclosure is directed to a variable resistance memory device, comprising: a first conductive line extending in a first direction; a second conductive line extending in a second direction perpendicular to the first direction and spaced apart from the first conductive line in a third direction; a memory cell at an intersection between the first conductive line and the second conductive line; a first electrode between the first conductive line and the memory cell; and a second electrode between the second conductive line and the memory cell, wherein the memory cell comprises, in order, a switching pattern, an intermediate electrode on the switching pattern, a first resistivity control pattern on the intermediate electrode, a variable resistance pattern on the first resistivity control pattern, and a second resistivity control pattern on the variable resistance pattern, wherein a resistivity of the first resistivity control pattern is less than a resistivity of the second electrode, and wherein a resistivity of the second resistivity control pattern is greater than the resistivity of the first resistivity control pattern.

According to exemplary embodiments, the disclosure is directed to a variable resistance memory device, comprising: a first word line and a second word line that extend in a first direction; a bit line between the first and second word lines and extending in a second direction intersecting the first direction; a first memory cell at an intersection between the first word line and the bit line; and a second memory cell at an intersection between the second word line and the bit line, wherein the first memory cell comprises a first switching pattern, a first intermediate electrode, a first resistivity control pattern, a first variable resistance pattern, and a second resistivity control pattern that are arranged from the first word line to the bit line, and wherein the second memory cell comprises in the following order: a second switching pattern, a second intermediate electrode, a third resistivity control pattern, a second variable resistance pattern, and a fourth resistivity control pattern that are arranged from the bit line to the second word line.

DETAILED DESCRIPTION OF EMBODIMENTS

Figure 1:
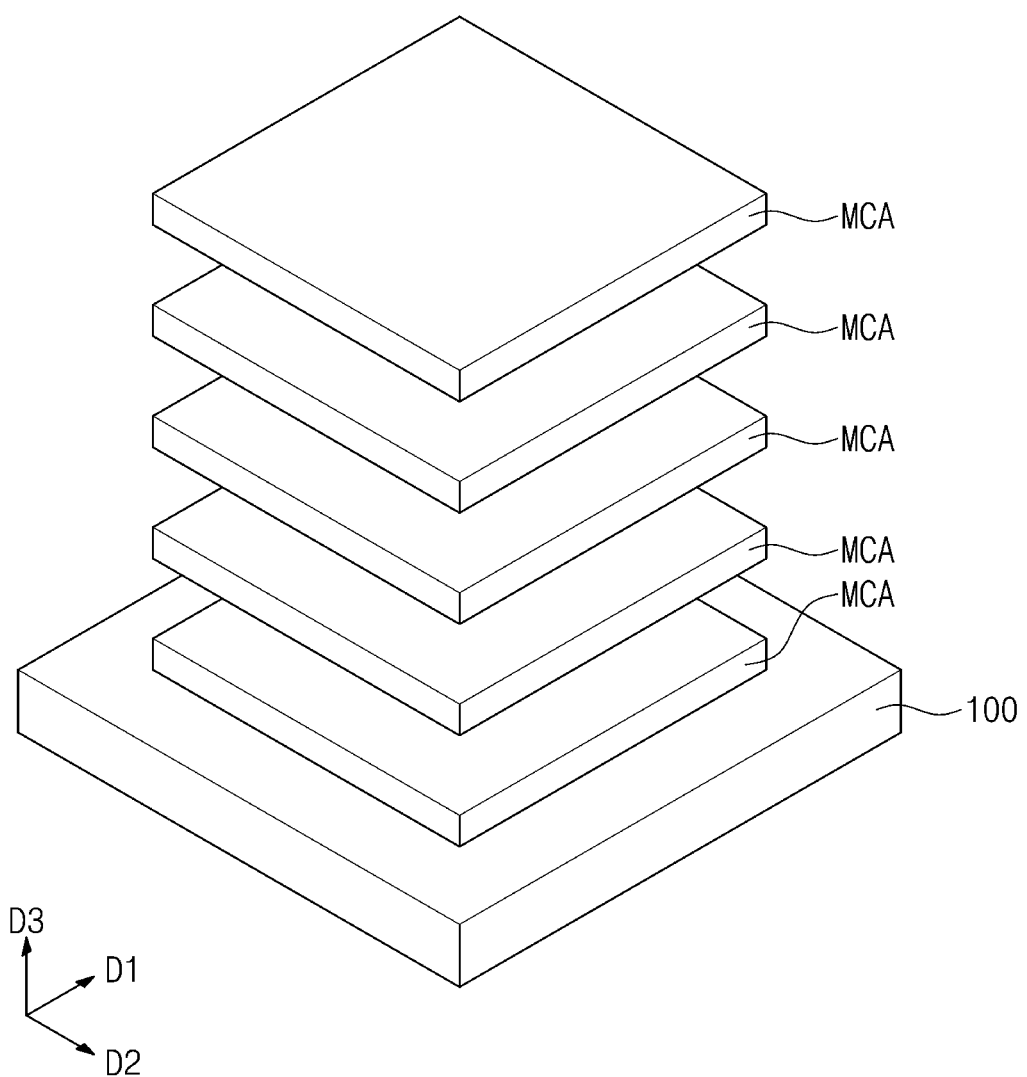
FIG. 1 illustrates a conceptual view showing a variable resistance memory device, according to exemplary embodiments.

Discussed herein is a method of manufacturing a variable resistance memory device with reference to the drawings. Like reference numerals may indicate like components throughout the description.

FIG. 1 illustrates a conceptual view showing a variable resistance memory device, according to exemplary embodiments.

Referring to FIG. 1, a variable resistance memory device may include a plurality of memory cell stacks MCA sequentially stacked on a substrate 100. Each of the memory cell stacks MCA may include a plurality of two-dimensionally arranged memory cells. The variable resistance memory device may include a plurality of conductive lines that are disposed between the memory cell stacks MCA and are provided for writing, reading, and/or erasing operations of the memory cells. FIG. 1 shows five memory cell stacks MCA stacked on substrate 100, but exemplary embodiments are not limited thereto.

As used herein, a memory device may refer to a memory chip, stack of memory chips, or a package including a package substrate and one or more memory chips. In some embodiments, each MCA may be a separate semiconductor chip.

Figure 2A:
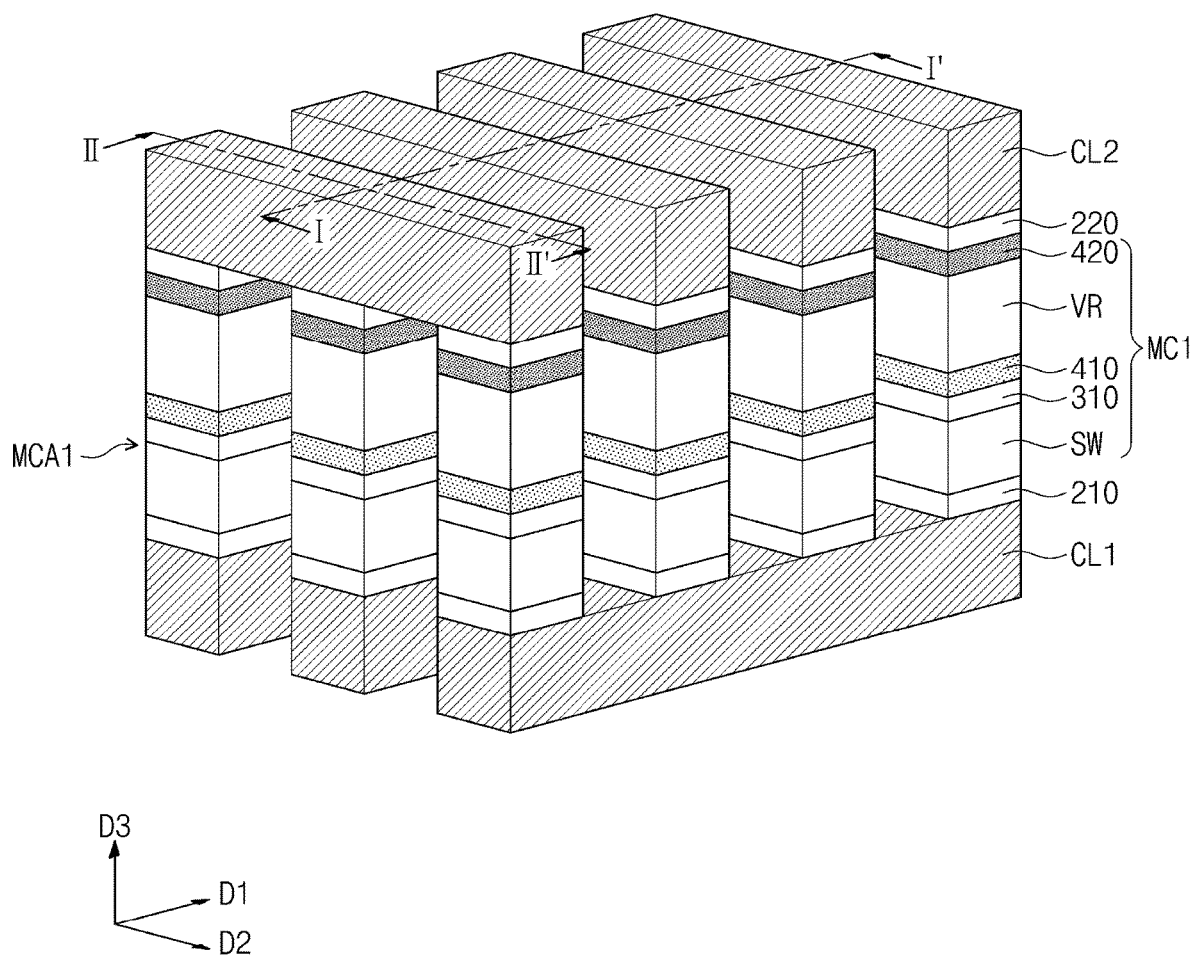
FIG. 2A illustrates a simplified perspective view showing a variable resistance memory device, according to exemplary embodiments.
Figure 2B:
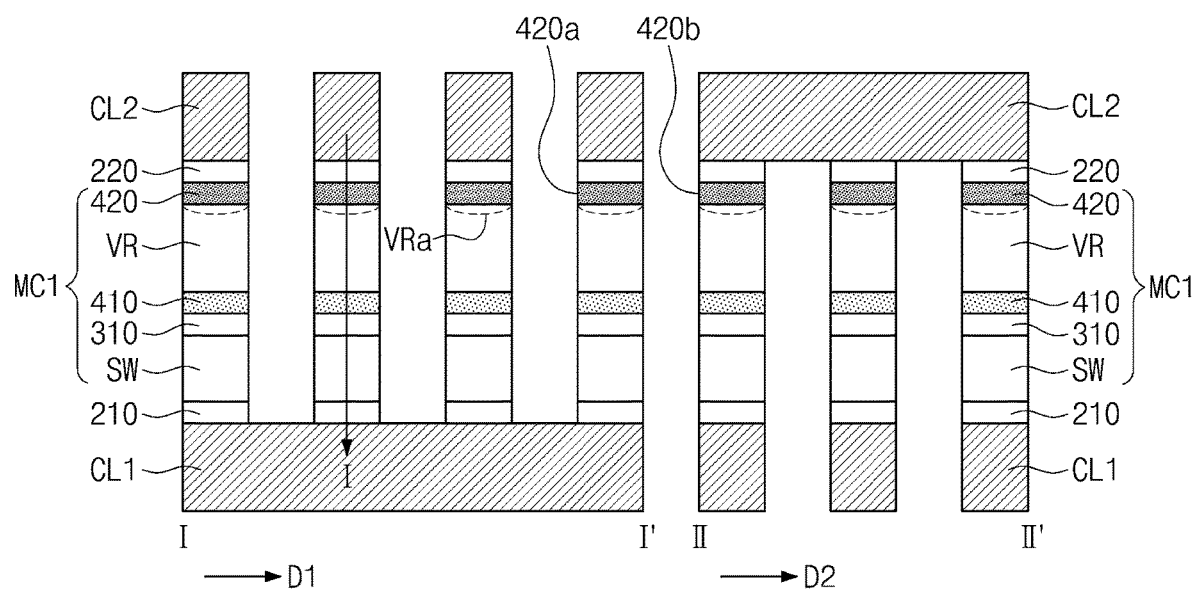
FIG. 2B illustrates a cross-sectional view taken along lines I-I' and II-IF of FIG. 2A.
Figure 2C:
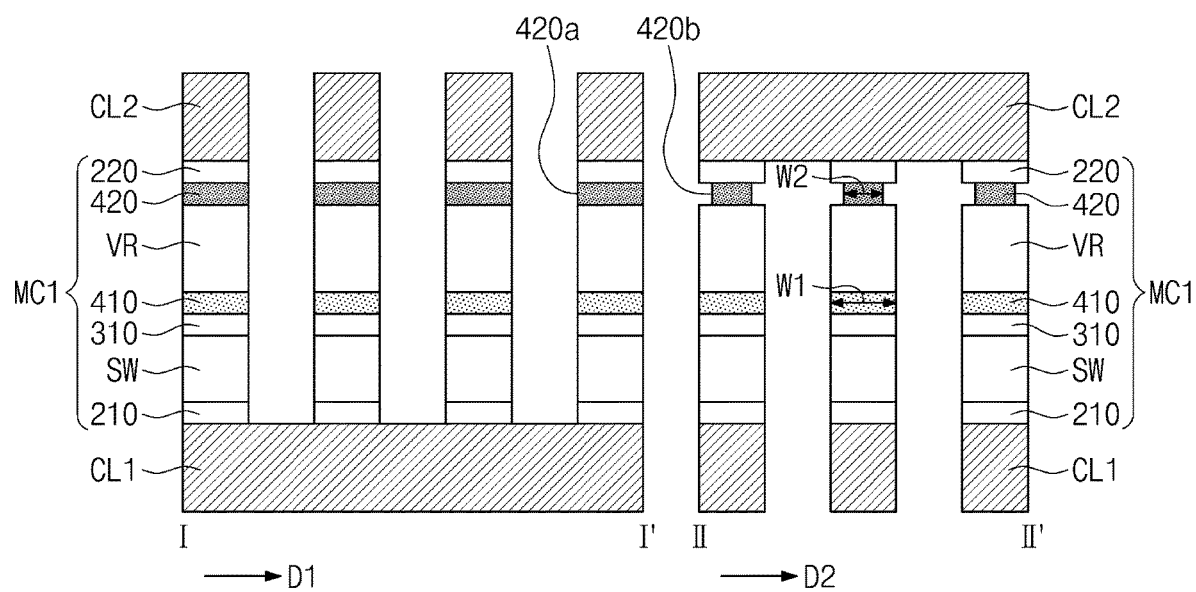
FIGS. 2C and 2D illustrate cross-sectional views showing a variable resistance memory device, according to exemplary embodiments.
Figure 2D:
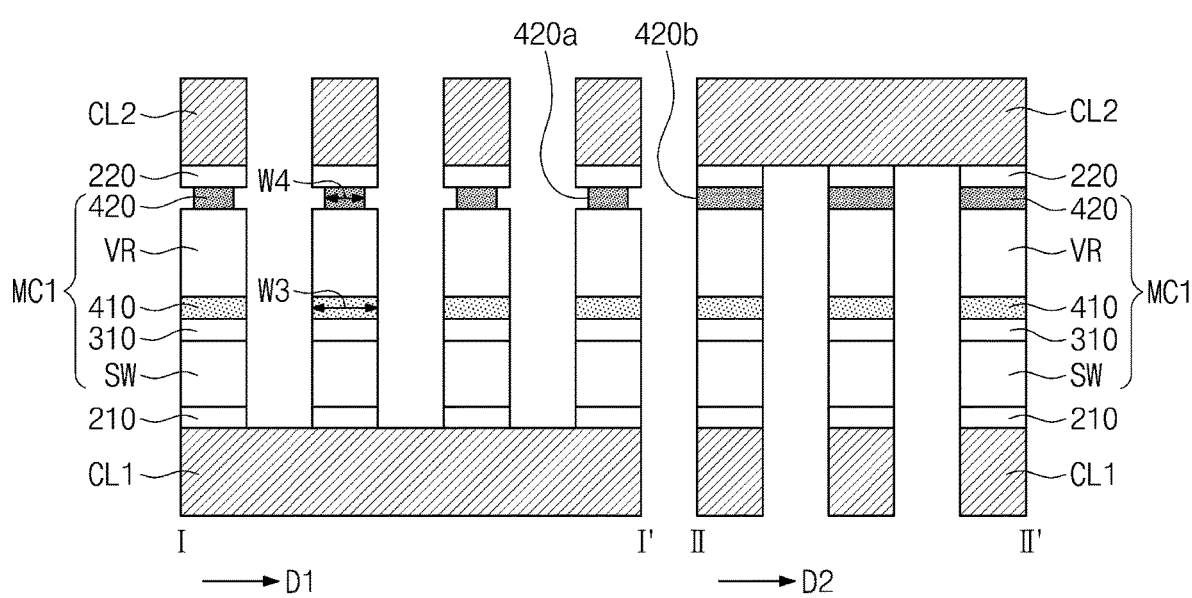

FIG. 2A illustrates a simplified perspective view showing a variable resistance memory device, according to exemplary embodiments. FIG. 2B illustrates a cross-sectional view taken along lines I-I' and II-IF of FIG. 2A. FIGS. 2C and 2D illustrate cross-sectional views showing a variable resistance memory device, according to exemplary embodiments. For convenience of explanation, some components are not shown in FIGS. 2A to 2D.

Referring to FIGS. 2A and 2B, a substrate (not shown) may be provided with first conductive lines CL1 and second conductive lines CL2 disposed thereon. The first conductive lines CL1 may extend in a first direction D1, and may be parallel to each other, and spaced apart from each other in a second direction D2. The first conductive lines CL1 may be word lines. The second conductive lines CL2 may be spaced apart from the first conductive lines CL1 along a third direction D3 perpendicular to the first and second directions D1 and D2. The second conductive lines CL2 may extend in the second direction D2, and may be parallel to each other, and spaced apart from each other in the first direction D1. The second conductive lines CL2 may be bit lines. The first and second conductive lines CL1 and CL2 may include metal (e.g., copper, tungsten, or aluminum) and/or metal nitride (e.g., tantalum nitride, titanium nitride, or tungsten nitride).

A first memory cell stack MCA1 may be provided between the first conductive lines CL1 and the second conducive lines CL2. The first memory cell stack MCA1 may include memory cells MC1 provided at intersections between the first conductive lines CL1 and the second conductive lines CL2. The memory cells MC1 may be two-dimensionally arranged along the first and second directions D1 and D2. Although only one memory cell stack MCA1 is illustrated in FIGS. 2A-2D for convenience of description, as discussed in connection with FIG. 1, a plurality of memory cell stacks may be stacked along the third direction D3 on the substrate (not shown). In this case, the substrate (not shown) may be provided thereon with repeatedly stacked structures corresponding to the first memory cell stack MCA1 and the first and second conductive lines CL1 and CL2.

The memory cells MC1 may be electrically connected to the first conductive lines CL1 and the second conductive lines CL2 through first electrodes 210 and second electrodes 220. For example, each of the first electrodes 210 may be disposed between one first conductive line CL1 and one memory cell MC1, and thus the first electrodes 210 may electrically connect the first conductive lines CL1 to the memory cells MC1. Each of the second electrodes 220 may be disposed between one memory cell MC1 and one second conductive line CL2, and thus the second electrodes 220 may electrically connect the memory cells MC1 to the second conductive lines CL2. The first and second electrodes 210 and 220 may include one or more of W, Ti, Al, Cu, C, and CN.

Each of the memory cells MC1 may include a switching pattern SW, an intermediate electrode 310, a first resistivity control pattern 410, a variable resistance pattern VR, and a second resistivity control pattern 420. The switching pattern SW, the intermediate electrode 310, the first resistivity control pattern 410, the variable resistance pattern VR, and the second resistivity control pattern 420 included in each of the memory cells MC1 may be connected in series between a pair of first and second conductive lines CL1 and CL2 that are coupled to the memory cell MC1. For example, in certain embodiments, a first electrode 210 may be disposed on and electrically connected to the first conductive line CL1, the switching pattern SW may be disposed on and electrically connected to the first electrode 210, the intermediate electrode 310 may be disposed on and electrically connected to the switching pattern SW, the first resistivity control pattern 410 may be disposed on and electrically connected to the intermediate electrode 310, the variable resistance pattern VR may be disposed on and electrically connected to the first resistivity control pattern 410, the second resistivity control pattern 420 may be disposed on and electrically connected to the variable resistance pattern VR, a second electrode 220 may be disposed on and electrically connected to the second resistivity control pattern 420, and the second conductive line CL2 may be disposed on and electrically connected to second electrode 220, in that order. Although FIGS. 2A and 2B show the variable resistance pattern VR is connected onto the switching pattern SW, exemplary embodiments are not limited thereto. For example, differently from that shown in FIGS. 2A and 2B, the switching pattern SW may be connected onto the variable resistance pattern VR.

The variable resistance pattern VR may be formed of a material capable of storing data. In some embodiments, the variable resistance pattern VR may include a material whose phase can be reversibly changed between a crystalline state and an amorphous state depending on a temperature of the material included in the variable resistance pattern VR. For example, the variable resistance pattern VR may have a phase transition temperature of about 250° C. to 350° C. required to induce a phase transition between the crystalline state and the amorphous state. In these embodiments, the variable resistance pattern VR may include a compound in which one or more of Te and Se (chalcogen elements) are combined with one or more of Ge, Sb, Bi, Pb, Sn, Ag, As, S, Si, In, Ti, Ga, P, O, and C. For example, the variable resistance pattern VR may include one or more of GeSbTe, GeTeAs, SbTeSe, GeTe, SbTe, SeTeSn, GeTeSe, SbSeBi, GeBiTe, GeTeTi, InSe, GaTeSe, and InSbTe. Alternatively, the variable resistance pattern VR may include a super-lattice structure in which a Ge-containing layer (e.g., GeTe layer) and a Ge-free layer (e.g., SbTe layer) are repeatedly stacked.

In other embodiments, the variable resistance pattern VR may include one or more of a perovskite compound or a conductive metal oxide. For example, the variable resistance pattern VR may include one or more of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, and barium-strontium-zirconium oxide. Alternatively, the variable resistance pattern VR may be, or may include, either a structure (or double-layered structure) including a conductive metal oxide layer and a tunnel insulating layer, or a structure (or triple-layered structure) including a first conductive metal oxide layer, a tunnel insulating layer, and a second conductive metal oxide layer. In this case, the tunnel insulating layer may include aluminum oxide, hafnium oxide, or silicon oxide.

The switching pattern SW may be, or may include, a device configured to switch phases based on a threshold switching phenomenon having a nonlinear I-V curve (e.g., S-type I-V curve). For example, the switching pattern SW may be, or may include, an OTS (Ovonic Threshold Switch) device having bi-directional characteristics. The switching pattern SW may have a phase transition temperature for transitioning between a crystalline state and an amorphous state that is greater than a phase transition temperature of the variable resistance pattern VR. For example, the switching pattern SW may have a phase transition temperature of about 350° C. to about 450° C. Therefore, when operating a variable resistance memory device according to some embodiments, the variable resistance pattern VR may be configured to reversibly change phase between its crystalline and amorphous states, while the switching pattern SW may be configured to maintain its substantially amorphous state without the phase transition. In this description, the substantially amorphous state may not exclude the presence of a locally crystalline grain boundary or a locally crystalline portion in an object (e.g., the switching pattern SW). For example, "substantially amorphous state" may mean that a locally crystallized grain boundary may exist in a portion of the object or a locally crystallized portion exists in the object. The switching pattern SW may be formed of a compound in which one or more of Te and Se (chalcogen elements) are combined with one or more of Ge, Sb, Bi, Al, Pb, Sn, Ag, As, S, Si, In, Ti, Ga and P. The switching pattern SW may further include a thermal stabilization element. The thermal stabilization element may be or include one or more of C, N, and O. For example, the switching pattern SW may include one or more of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

The switching pattern SW and the variable resistance pattern VR may be electrically connected to each other through the intermediate electrode 310 therebetween. The intermediate electrode 310 may include one or more of W, Ti, Al, Cu, C, and CN.

The first resistivity control pattern 410 may be disposed between the intermediate electrode 310 and the variable resistance pattern VR, and the second resistivity control pattern 420 may be disposed between the variable resistance pattern VR and the second electrode 220. The first resistivity control pattern 410 may be in contact with a bottom surface of the variable resistance pattern VR, and the second resistivity control pattern 420 may be in contact with a top surface of the variable resistance pattern VR. For example, a top surface of the first resistivity control pattern 410 may physically contact and electrically connect to a bottom surface of the variable resistance pattern VR, and a bottom surface of the second resistivity control pattern 420 may physically contact and electrically connect to a top surface of the variable resistance pattern VR. As discussed herein, "contact" or "in contact with" may refer to a direct connection, e.g., touching. When viewed in a plan view, the first and second resistivity control patterns 410 and 420 may have the same shape. The first and second resistivity control patterns 410 and 420 may have the same width in the first direction D1, and also have the same width in the second direction D2. For example, in FIGS. 2A and 2B, the first and second resistivity control patterns 410 and 420 each may have rectangular shapes of the same size, and the first and second resistivity control patterns 410 and 420 may overlap one another, when viewed in plan view. Each of the first and second resistivity control patterns 410 and 420 may have side surfaces aligned with that of the variable resistance pattern VR. For example, side surfaces of the first resistivity control pattern 410, the second resistivity control pattern 420, and the variable resistance pattern VR may be aligned with one another along the third direction D3. The second resistivity control pattern 420 may have resistivity greater than that of the first resistivity control pattern 410. For example, the first resistivity control pattern 410 may have resistivity of about 50 μΩ·cm to about 500 μΩ·cm. The second resistivity control pattern 420 may have resistivity of about 5,000 μΩ·cm to about 20,000 μΩ·cm. The resistivity of the first resistivity control pattern 410 may be less than that of the second electrode 220. The first resistivity control pattern 410 may include TiN. The second resistivity control pattern 420 may include TiSiN, W, Ti, Co, and/or TiN. A material included in the first and second resistivity control patterns 410 and 420 may not be limited to the materials mentioned above, and the second resistivity control pattern 420 may include a material that allows having resistivity greater than that of the first resistivity control pattern 410.

In some embodiments, the second resistivity control pattern 420 may not be provided. In this case, the second electrode 220 may be in contact with the top surface of the variable resistance pattern VR. For example, a bottom surface of the second electrode 220 may physically contact and electrically connect to the top surface of the variable resistance pattern VR. The second electrode 220 may have resistivity greater than that of the first resistivity control pattern 410. For example, the second electrode 220 may have resistivity of about 5,000 μΩ·cm to about 20,000 μΩ·cm. It will be explained below a variable resistance memory device including the second resistivity control pattern 420.

Although not shown, a barrier metal layer may be disposed in at least one of between the intermediate electrode 310 and the first resistivity control pattern 410 and between the second resistivity control pattern 420 and the second electrode 220. The barrier metal layer may prevent materials from diffusing between the intermediate electrode 310 and the first resistivity control pattern 410 and between the second resistivity control pattern 420 and the second electrode 220. In other embodiments, the barrier metal layer may not be provided.

In some embodiments, the second resistivity control pattern 420 may heat the variable resistance pattern VR, thereby causing the variable resistance pattern VR to undergo a phase change. An upper portion VRa of the variable resistance pattern VR may be phase-changed such that a reset operation may be performed. The upper portion VRa may be a concave-shaped area of the variable resistance pattern VR near the interface between the upper portion VRa and the second resistivity control pattern 420.

The variable resistance pattern VR may have a top surface in contact with the second resistivity control pattern 420 having high resistivity and a bottom surface in contact with the first resistivity control pattern 410 having low resistivity. Since the top surface of the variable resistance pattern VR is contact with the second resistivity control pattern 420 having high resistivity, Joule heating may occur at an interface between the variable resistance pattern VR and the second resistivity control pattern 420. For example, as illustrated in FIG. 2B, an electric current I may flow from the second conductive lines CL2 toward the first conductive lines CL1. When the electric current I flows, energy loss of electrons may occur between the second resistivity control pattern 420 and the variable resistance pattern VR. For example, heating may occur at an interface (e.g., the top surface of the variable resistance pattern VR) between the second resistivity control pattern 420 and the variable resistance pattern VR. Energy gain of electrons may occur between the variable resistance pattern VR and the first resistivity control pattern 410. For example, heat loss (or cooling) may occur at an interface (e.g., the bottom surface of the variable resistance pattern VR) between the variable resistance pattern VR and the first resistivity control pattern 410.

In a variable resistance memory device according to some embodiments, the upper portion VRa of the variable resistance pattern VR may be locally heated for the phase change of the variable resistance pattern VR. For example, the variable resistance pattern VR may be provided on its opposite ends with the resistivity control patterns 410 and 420 having different resistivities, and thus heating may occur at an interface on only one end of the variable resistance pattern VR. Accordingly, the variable resistance pattern VR as a whole may be prevented from being heated, and may be protected from heat-induced damage. As a result, a variable resistance memory device according to some embodiments may increase in operating reliability and stability.

Referring to FIGS. 2C and 2D, in some embodiments, the first and second resistivity control patterns 410 and 420 may have different shapes from each other. When viewed in a plan view, the second resistivity control pattern 420 may have an area less than that of the first resistivity control pattern 410 and/or that of the variable resistance pattern VR. For example, the second resistivity control pattern 420 may have a width different from that of the first resistivity control pattern 410 and/or that of the variable resistance pattern VR.

As illustrated in FIG. 2C, a width W2 in the second direction D2 of the second resistivity control pattern 420 may be less than a width W1 in the second direction D2 of the first resistivity control pattern 410. In this configuration, the first resistivity control pattern 410 may have side surfaces aligned with those of the variable resistance pattern VR. The second resistivity control pattern 420 may have first side surfaces 420a in the first direction D1 and second side surfaces 420b in the second direction D2. The first side surfaces 420a of the second resistivity control pattern 420 may be aligned with the corresponding side surfaces of the variable resistance pattern VR, and the second side surfaces 420b of the second resistivity control pattern 420 may be misaligned with the corresponding side surface of the variable resistance pattern VR. For example, the second side surfaces 420b of the second resistivity control pattern 420 may have a shape recessed from the side surface of the variable resistance pattern VR. The width of the second resistivity control pattern 420 in the second direction D2 may be smaller than the width of the variable resistance pattern VR in the second direction D2.

Alternatively, as illustrated in FIG. 2D, a width W4 in the first direction D1 of the second resistivity control pattern 420 may be less than a width W3 in the first direction D1 of the first resistivity control pattern 410. In such a case, the first resistivity control pattern 410 may have side surfaces aligned with that of the variable resistance pattern VR. The second side surfaces 420b of the second resistivity control pattern 420 may be aligned with the corresponding side surfaces of the variable resistance pattern VR, and the first side surfaces 420a of the second resistivity control pattern 420 may be misaligned with the corresponding side surface of the variable resistance pattern VR. For example, the first side surface 420a of the second resistivity control pattern 420 may have a shape recessed from the side surface of the variable resistance pattern VR. The width of the second resistivity control pattern 420 in the first direction D1 may be smaller than the width of the variable resistance pattern VR in the first direction D1.

Dissimilarly, although not shown, the width W4 in the first direction D1 of the second resistivity control pattern 420 may be less than the width W3 in the first direction D1 of the first resistivity control pattern 410, and the width W2 in the second direction D2 of the second resistivity control pattern 420 may be less than the width W1 in the second direction D2 of the first resistivity control pattern 410.

In some embodiments, the area of the second resistivity control pattern 420 may be less than that of the variable resistance pattern VR. For example, a contact area between the bottom surface of the second resistivity control pattern 420 and the top surface of the variable resistance pattern VR may be less than the area of the variable resistance pattern VR in the first and second direction D1 and D2. Accordingly, the second resistivity control pattern 420 and the variable resistance pattern VR may have therebetween an interface at which heating occurs and of which the area is small, and the small area of the interface may reduce power consumed for the reset operation. Therefore, a variable resistance memory device may increase in electrical characteristics.

In addition, the second resistivity control pattern 420 may be designed to have areas of different sizes in accordance with phase change characteristics of the variable resistance pattern VR, and thus it may be easy to design variable resistance memory devices having various characteristics.

FIGS. 3A to 9A illustrate perspective views showing a variable resistance memory device, according to exemplary embodiments. FIGS. 3B to 9B illustrate cross-sectional views taken along lines IT and II-IF of FIG. 3A to 9B, showing a method of manufacturing a variable resistance memory device, according to exemplary embodiments. Components substantially the same as those discussed with reference to FIGS. 2A and 2B are allocated the same reference numerals thereto, and a repetitive description thereof will be omitted.

Figure 3A:
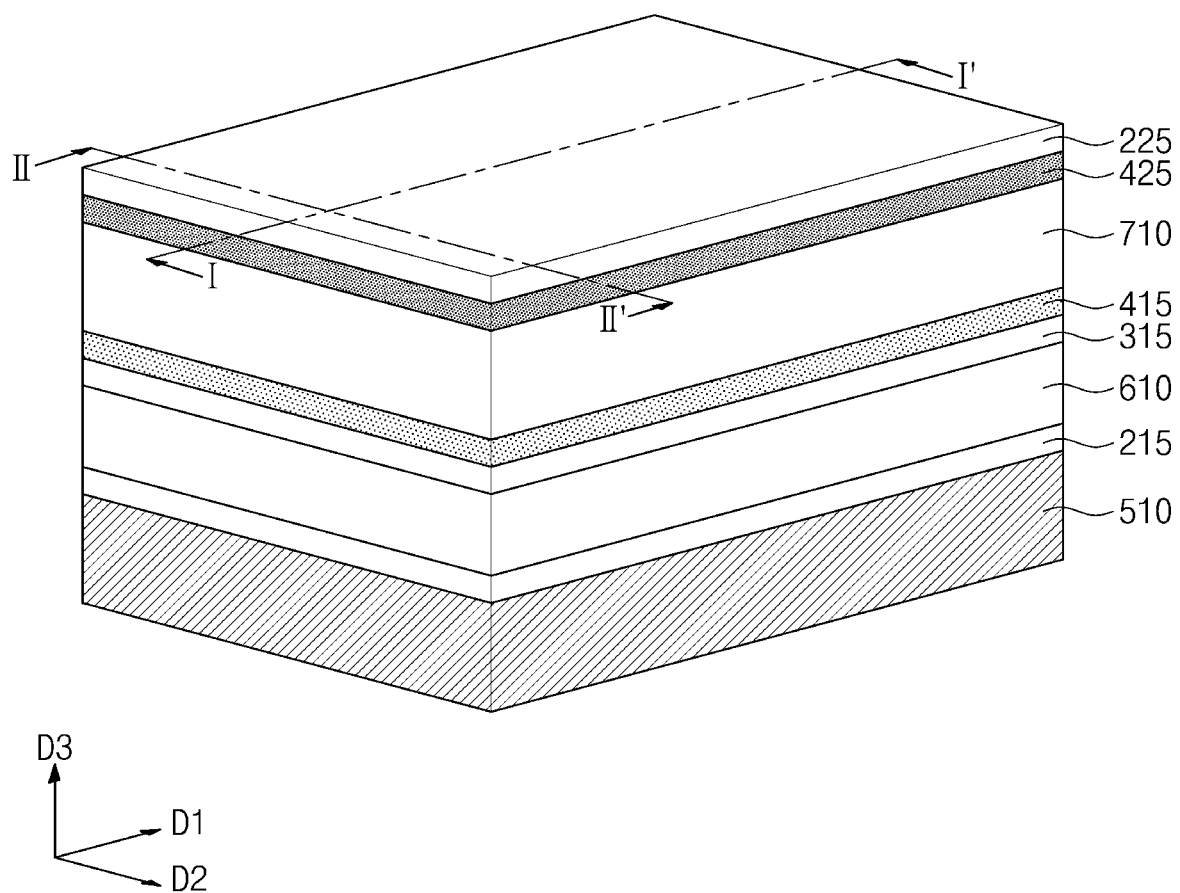
FIGS. 3A, 4A, 5A, 6A, 7A, 8A, and 9A illustrate perspective views showing a method of manufacturing a variable resistance memory device, according to exemplary embodiments.
Figure 3B:
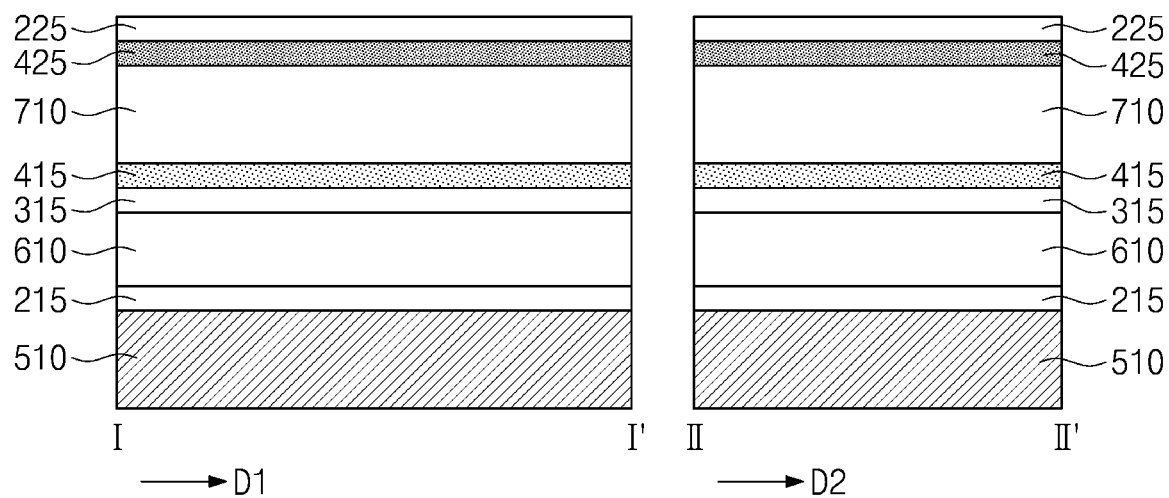
FIGS. 3B, 4B, 5B, 6B, 7B, 8B, and 9B illustrate cross-sectional views showing a method of manufacturing a variable resistance memory device, according to exemplary embodiments.

Referring to FIGS. 3A and 3B, a substrate (not shown) may be stacked thereon with a first conductive layer 510, a first preliminary electrode layer 215, a switching layer 610, a preliminary intermediate electrode layer 315, a first resistivity control layer 415, a variable resistance layer 710, a second resistivity control layer 425, and a second preliminary electrode layer 225.

Figure 4A:
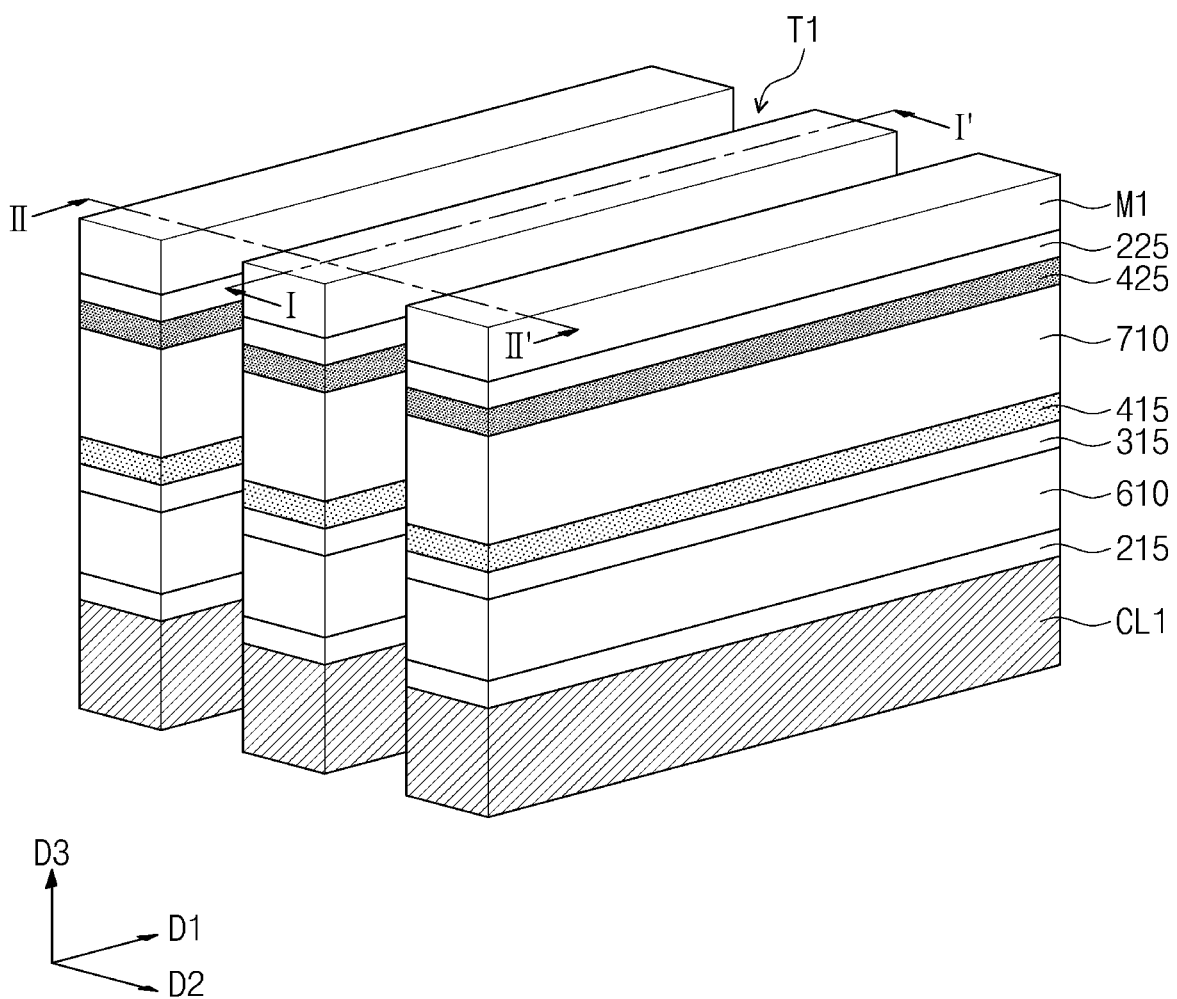
Figure 4B:
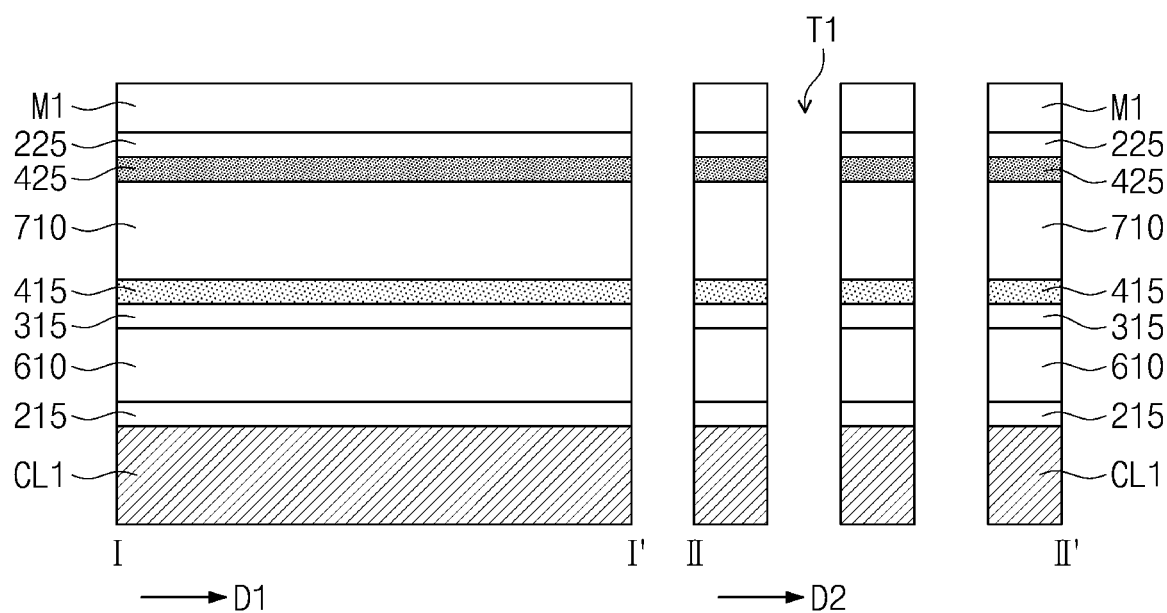

Referring to FIGS. 4A and 4B, a first patterning process may be performed on the first conductive layer 510, the first preliminary electrode layer 215, the switching layer 610, the preliminary intermediate electrode layer 315, the first resistivity control layer 415, the variable resistance layer 710, the second resistivity control layer 425, and the second preliminary electrode layer 225. For example, a first mask M1 may be formed on the second preliminary electrode layer 225. The first mask M1 may be used as an etching mask to etch the first conductive layer 510, the first preliminary electrode layer 215, the switching layer 610, the preliminary intermediate electrode layer 315, the first resistivity control layer 415, the variable resistance layer 710, the second resistivity control layer 425, and the second preliminary electrode layer 225. The first patterning process may form first trenches T1. The first trenches T1 may penetrate, in a third direction D3, the first conductive layer 510, the first preliminary electrode layer 215, the switching layer 610, the preliminary intermediate electrode layer 315, the first resistivity control layer 415, the variable resistance layer 710, the second resistivity control layer 425, and the second preliminary electrode layer 225. The first trenches T1 may extend in a first direction D1. When the first patterning process is performed, the first conductive layer 510 may be etched to form first conductive lines CL1.

Figure 5A:
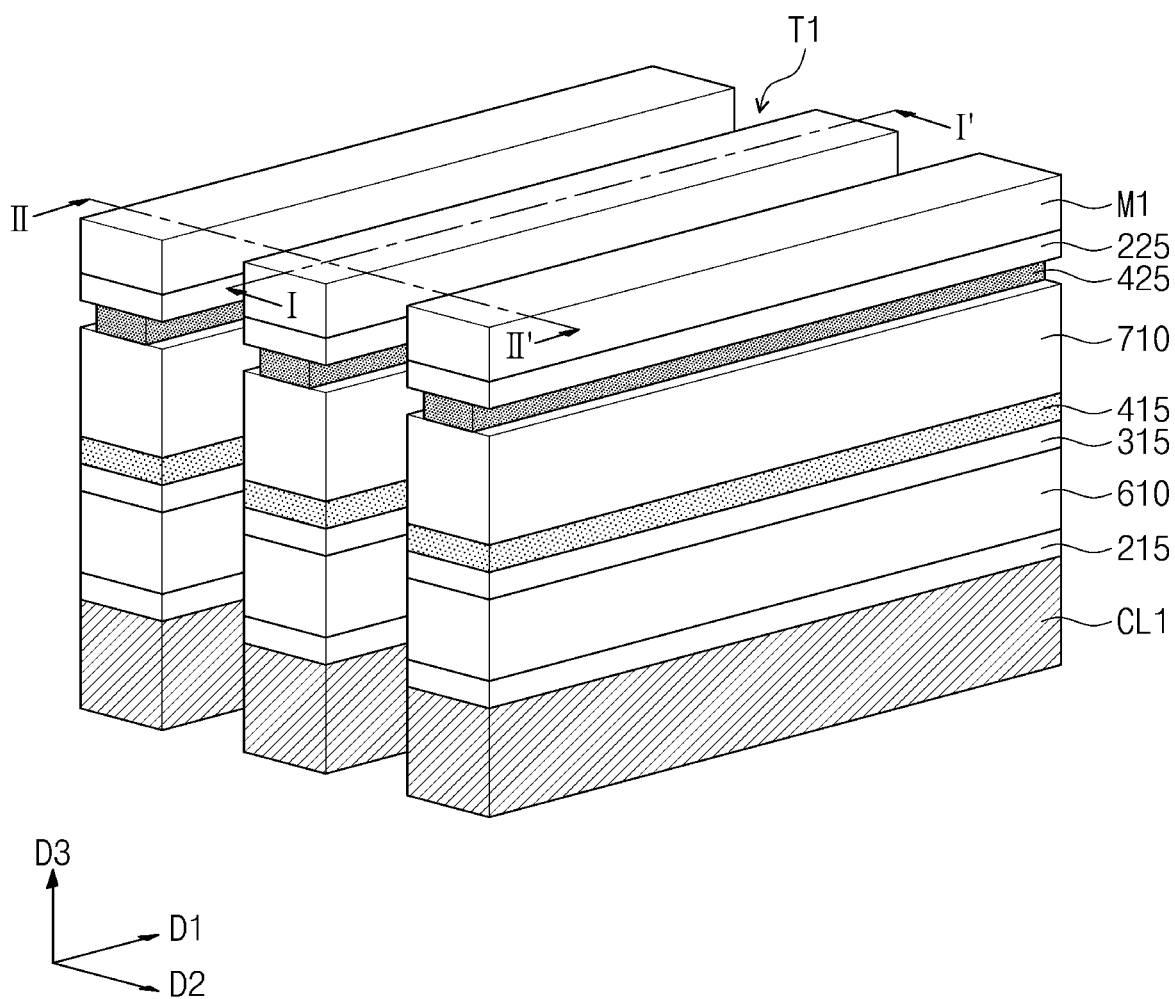
Figure 5B:
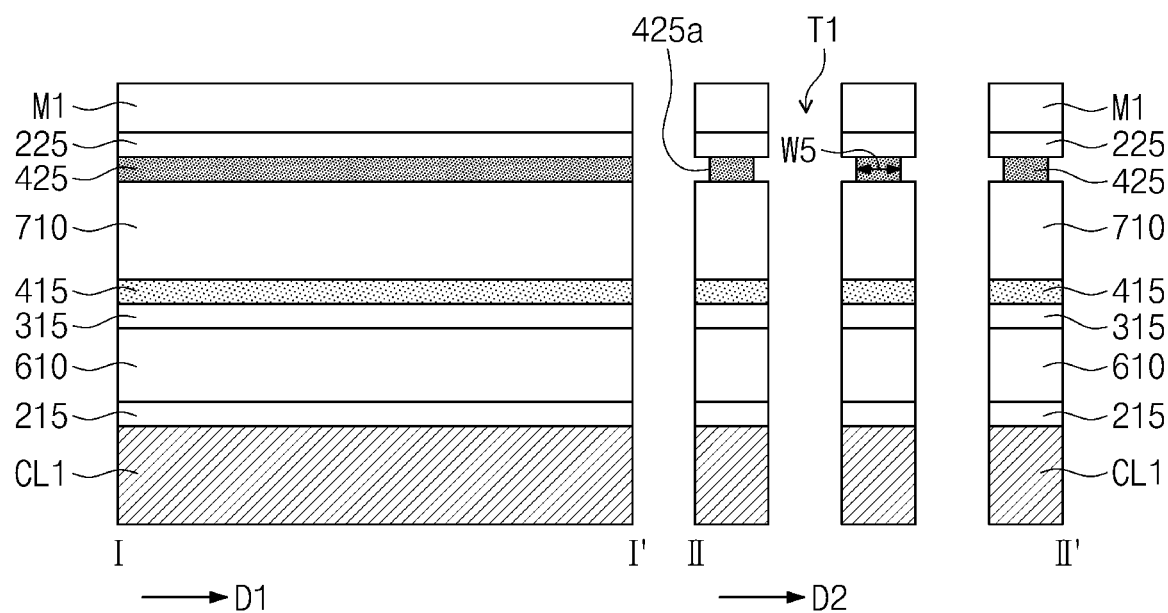

Referring to FIGS. 5A and 5B, an etching process may be performed to partially etch the patterned second resistivity control layer 425. For example, the second resistivity control layer 425 may have a third side surfaces 425a exposed to the first trenches T1, and the etching process may etch the third side surfaces 425a. The etching process may include a wet etching process. In this step, no etching may be executed on the first conductive lines CL1, the first preliminary electrode layer 215, the switching layer 610, the preliminary intermediate electrode layer 315, the first resistivity control layer 415, the variable resistance layer 710, and the second preliminary electrode layer 225. For example, the second resistivity control layer 425 may include a material different from that of the first resistivity control layer 415, and may exhibit an etch selectivity to the first conductive lines CL1, the first preliminary electrode layer 215, the switching layer 610, the preliminary intermediate electrode layer 315, the first resistivity control layer 415, the variable resistance layer 710, and the second preliminary electrode layer 225. Accordingly, the second resistivity control layer 425 may be selectively etched. The etching process may continue until the second resistivity control layer 425 has a desired width W5 in the second direction D2. The desired width W5 of the second resistivity control layer 425 may be smaller than the widths of each of the first conductive layer 510, the first preliminary electrode layer 215, the switching layer 610, the preliminary intermediate electrode layer 315, the first resistivity control layer 415, the variable resistance layer 710, and the second preliminary electrode layer 225 in the second direction D2. In some embodiments, the etching of the second resistivity control layer 425 may not be performed. In such embodiments, each of the first conductive layer 510, the first preliminary electrode layer 215, the switching layer 610, the preliminary intermediate electrode layer 315, the first resistivity control layer 415, the variable resistance layer 710, the second resistivity control layer 425, and the second preliminary electrode layer 225 may have a same width in the second direction D2. Hereinafter, it will be continuously explained based on a resultant structure illustrated in FIGS. 4A and 4B.

Figure 6A:
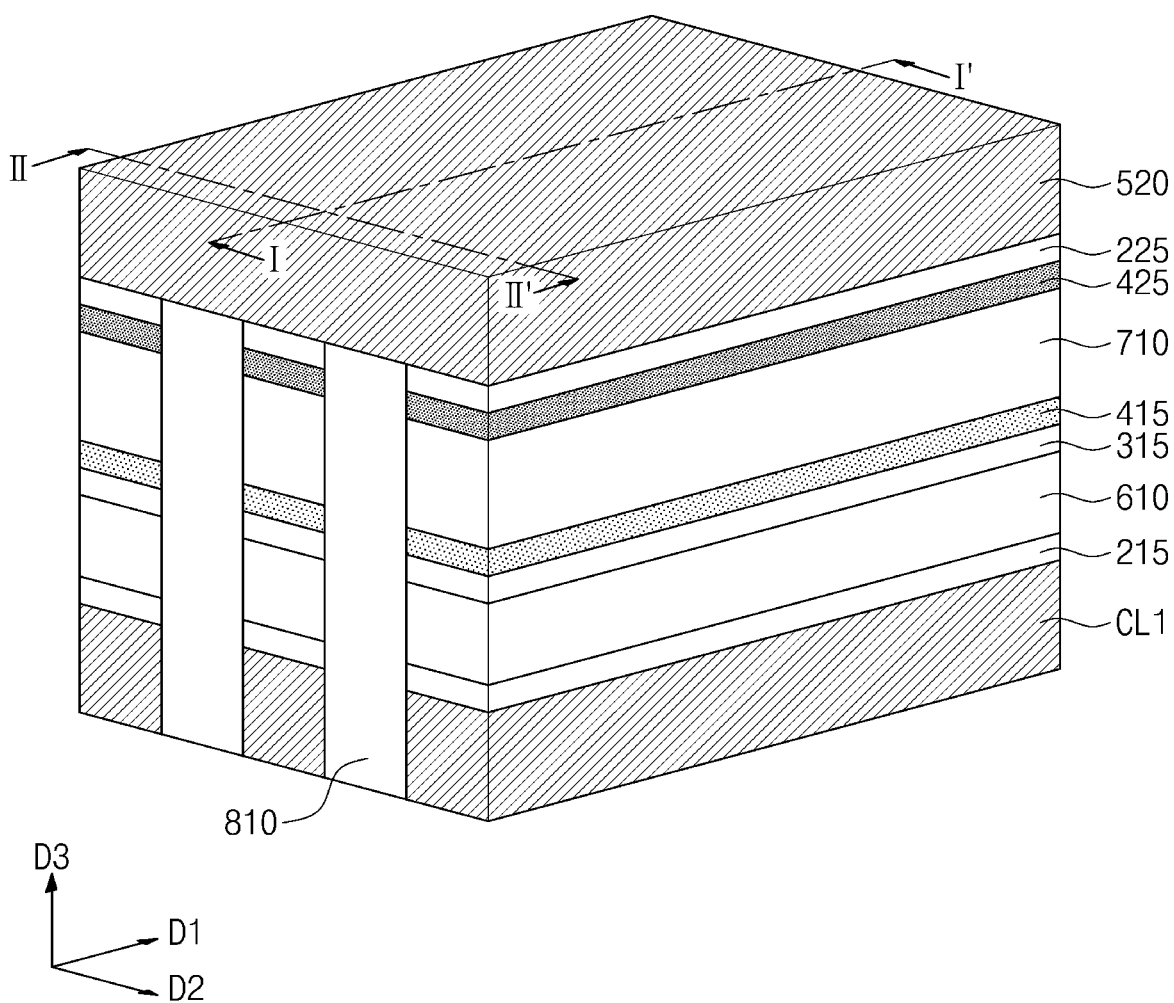
Figure 6B:
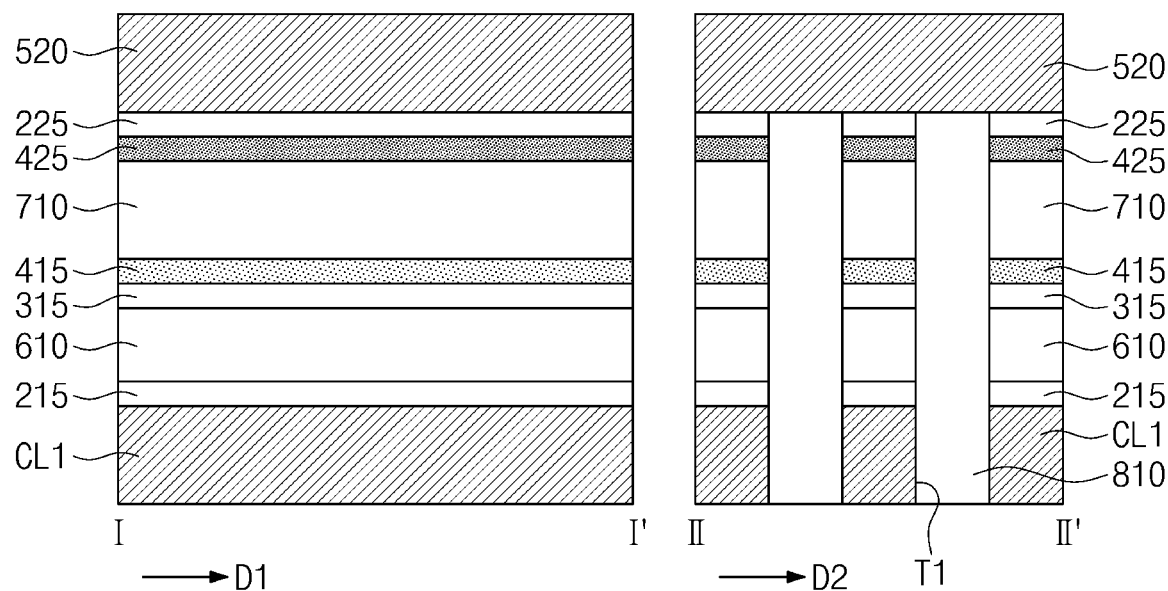

Referring to FIGS. 6A and 6B, after the first patterning process, the first mask M1 may be removed. Thereafter, a first insulating layer 810 may be formed to fill the first trenches T1. A top surface of the first insulating layer 810 and a top surface of the second preliminary electrode layer 225 may be located on the same plane. A second conductive layer 520 may be formed on the first insulating layer 810 and the second preliminary electrode layer 225. The second conductive layer 520 may cover the top surface of the first insulating layer 810 and the top surface of the second preliminary electrode layer 225. The first insulating layer 810 may include silicon nitride.

Figure 7A:
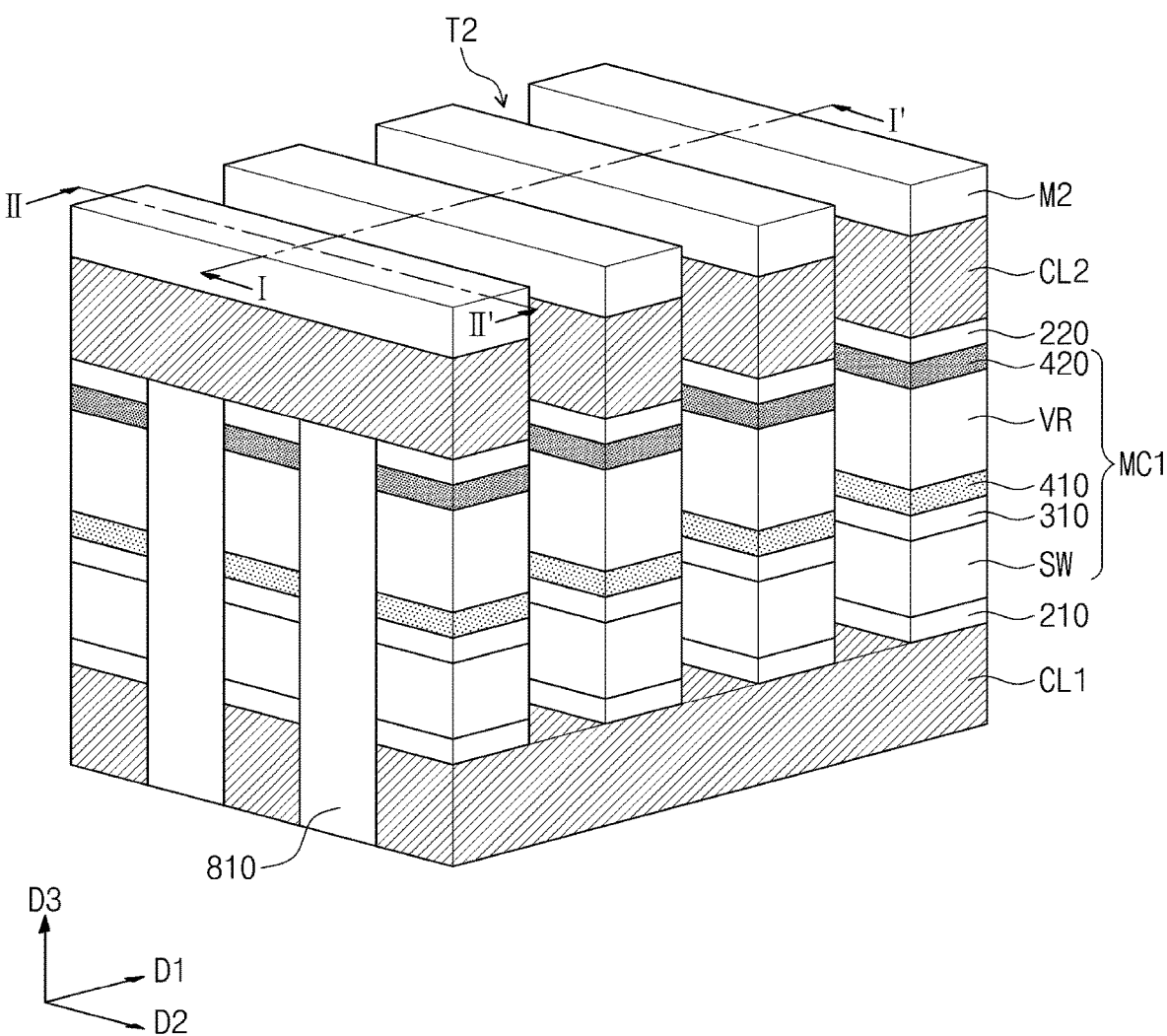
Figure 7B:
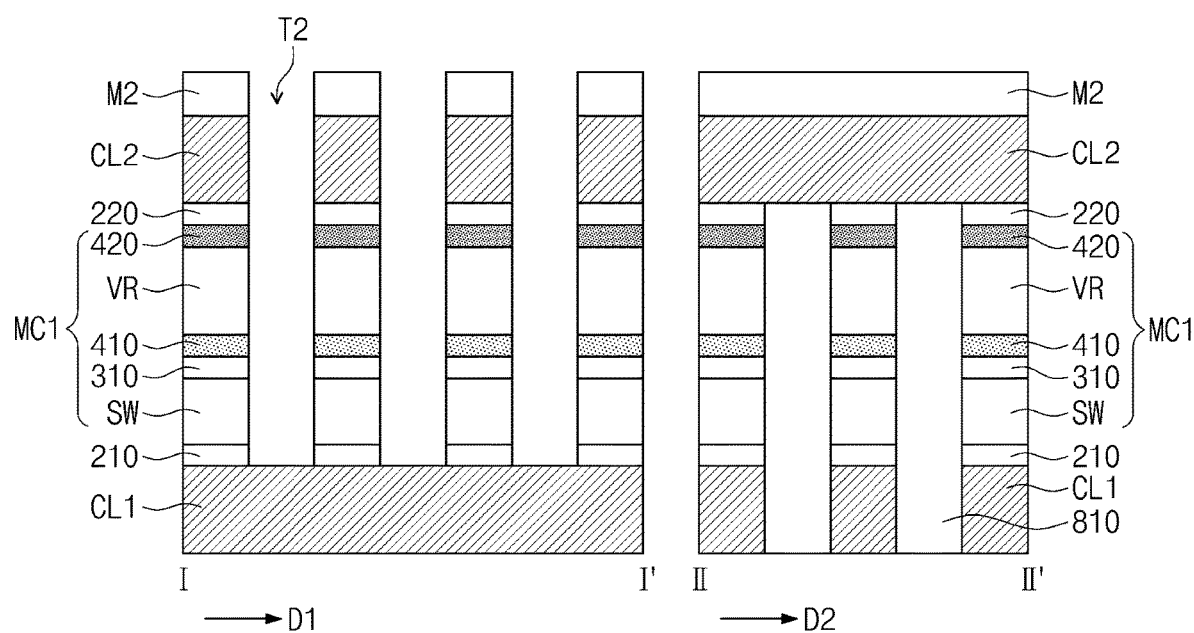

Referring to FIGS. 7A and 7B, a second patterning process may be performed on the first preliminary electrode layer 215, the switching layer 610, the preliminary intermediate electrode layer 315, the first resistivity control layer 415, the variable resistance layer 710, the second resistivity control layer 425, the second preliminary electrode layer 225, and the second conductive layer 520. For example, a second mask M2 may be formed on the second conductive layer 520. The second mask M2 may be used as an etching mask to etch the first preliminary electrode layer 215, the switching layer 610, the preliminary intermediate electrode layer 315, the first resistivity control layer 415, the variable resistance layer 710, the second resistivity control layer 425, the second preliminary electrode layer 225, and the second conductive layer 520. The second patterning process may form second trenches T2. The second trenches T2 may extend in a second direction D2. The second trenches T2 may penetrate, in the third direction D3, the first preliminary electrode layer 215, the switching layer 610, the preliminary intermediate electrode layer 315, the first resistivity control layer 415, the variable resistance layer 710, the second resistivity control layer 425, the second preliminary electrode layer 225, and the second conductive layer 520. The second trenches T2 may partially expose top surfaces of the first conductive lines CL1. The second patterning process may etch the first preliminary electrode layer 215, the switching layer 610, the preliminary intermediate electrode layer 315, the first resistivity control layer 415, the variable resistance layer 710, the second resistivity control layer 425, the second preliminary electrode layer 225, and the second conductive layer 520, thereby forming a first electrode 210, a switching pattern SW, an intermediate electrode 310, a first resistivity control pattern 410, a variable resistance pattern VR, a second resistivity control pattern 420, a second electrode 220, and second conductive lines CL2.

Figure 8A:
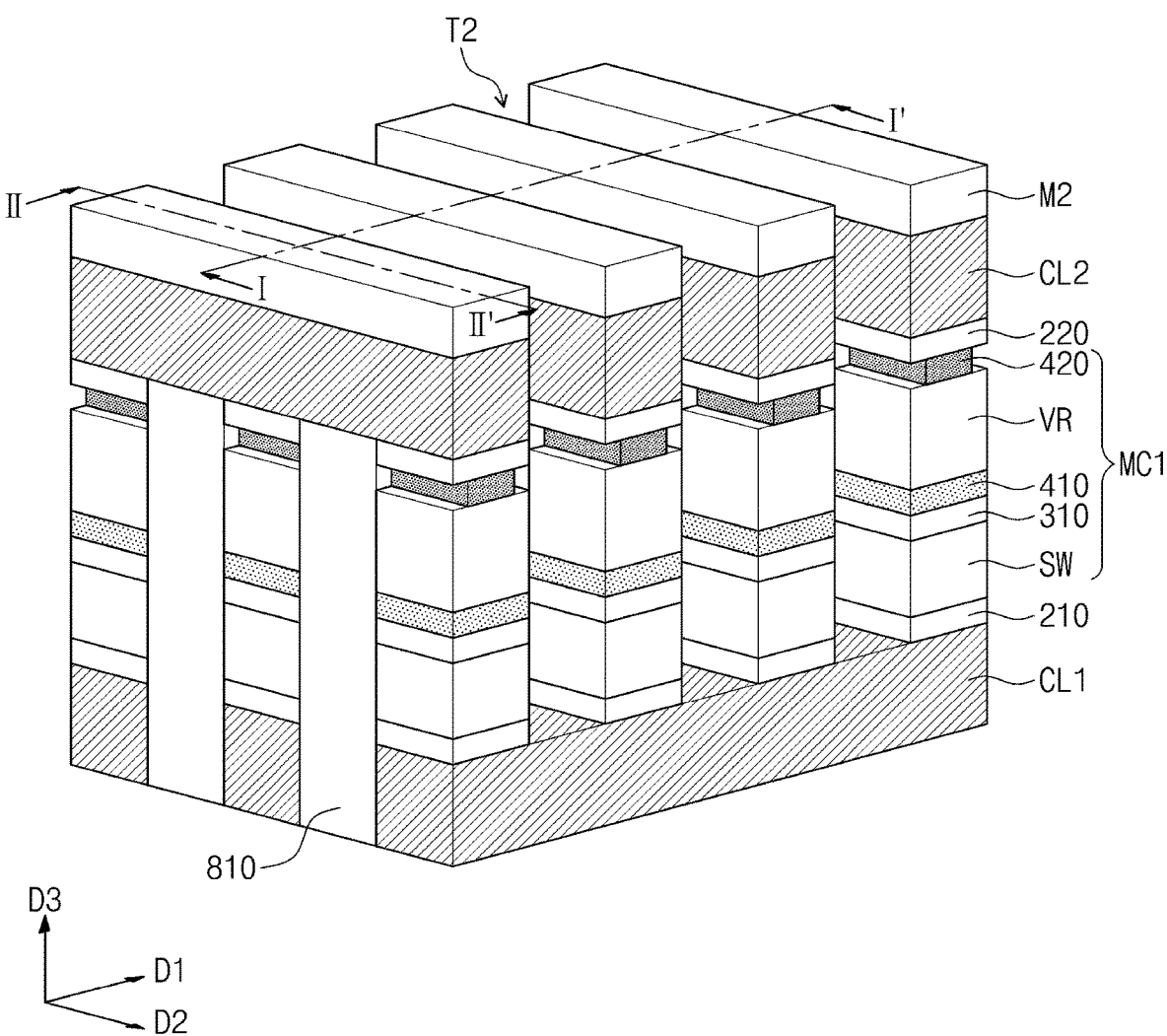
Figure 8B:
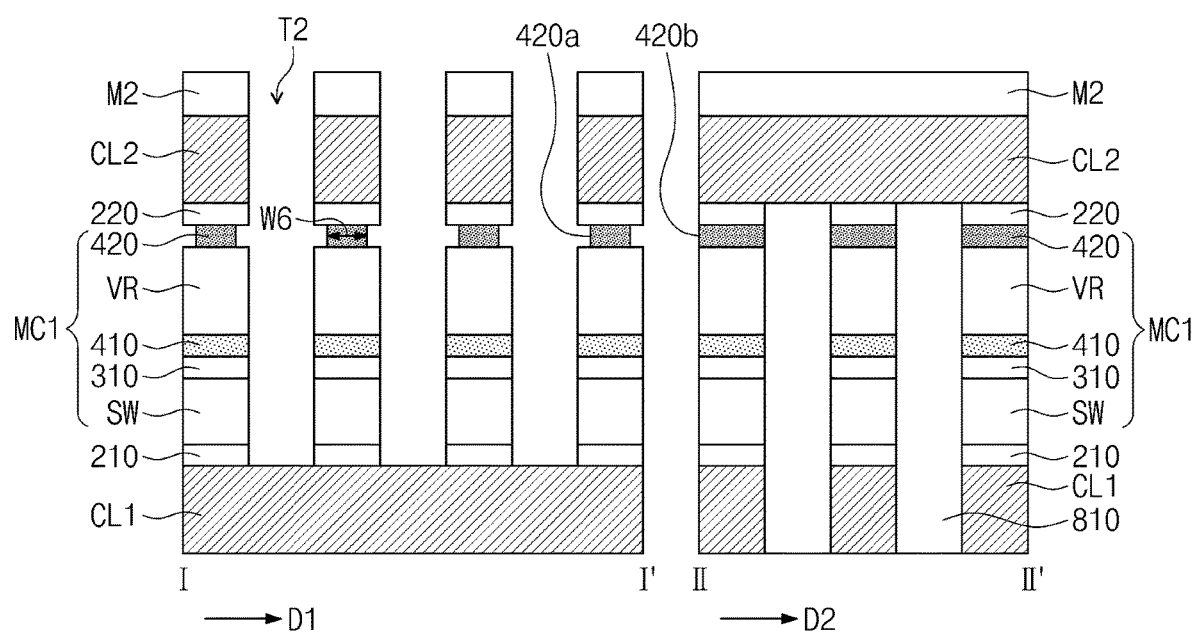

Referring to FIGS. 8A and 8B, an etching process may be performed to partially etch the second resistivity control pattern 420. For example, the second resistivity control pattern 420 may have first side surfaces 420a exposed to the second trenches T2, and the etching process may etch the first side surfaces 420a. The etching process may include a wet etching process. In this step, no etching may be executed on the first electrode 210, the switching pattern SW, the intermediate electrode 310, the first resistivity control pattern 410, the variable resistance pattern VR, the second electrode 220, and the second conductive lines CL2. For example, the second resistivity control pattern 420 may exhibit an etch selectivity to the first conductive lines CL1, the first electrode 210, the switching pattern SW, the intermediate electrode 310, the first resistivity control pattern 410, the variable resistance pattern VR, and the second electrode 220, and thus may be selectively etched. The etching process may continue until the second resistivity control pattern 420 has a desired width W6 in the first direction D1. The desired width W6 of the second resistivity control pattern 420 may be smaller than the widths of each of the first electrode 210, the switching pattern SW, the intermediate electrode 310, the first resistivity control pattern 410, the variable resistance pattern VR, the second electrode 220, and the second conductive lines CL2 in the first direction D1. In some embodiments, the etching of the second resistivity control pattern 420 may not be performed.

In such embodiments, each of the first electrode 210, the switching pattern SW, the intermediate electrode 310, the first resistivity control pattern 410, the variable resistance pattern VR, the second resistivity control pattern 420, the second electrode 220, and the second conductive lines CL2 may have a same width in the first direction D1. Hereinafter, it will be continuously explained based on a resultant structure illustrated in FIGS. 7A and 7B.

Figure 9A:
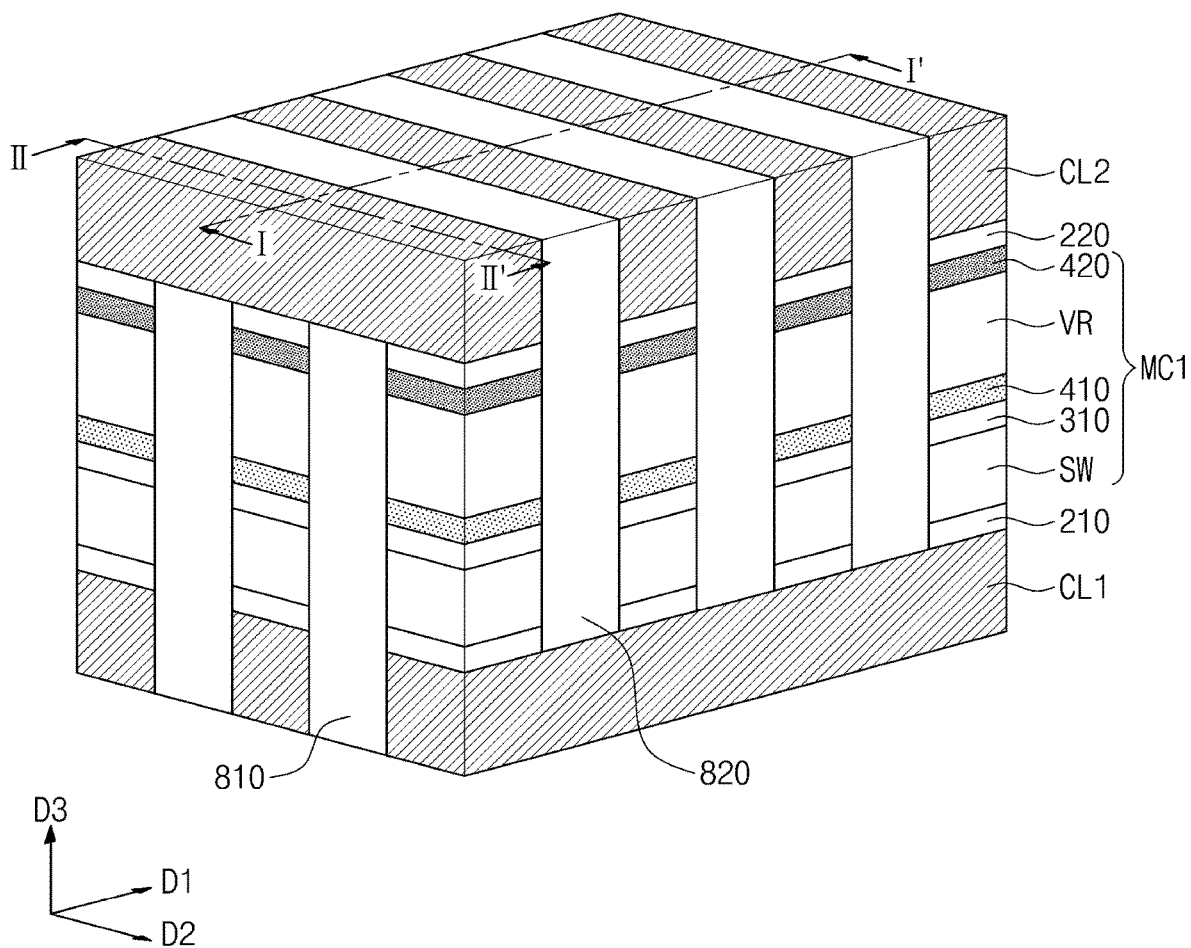
Figure 9B:
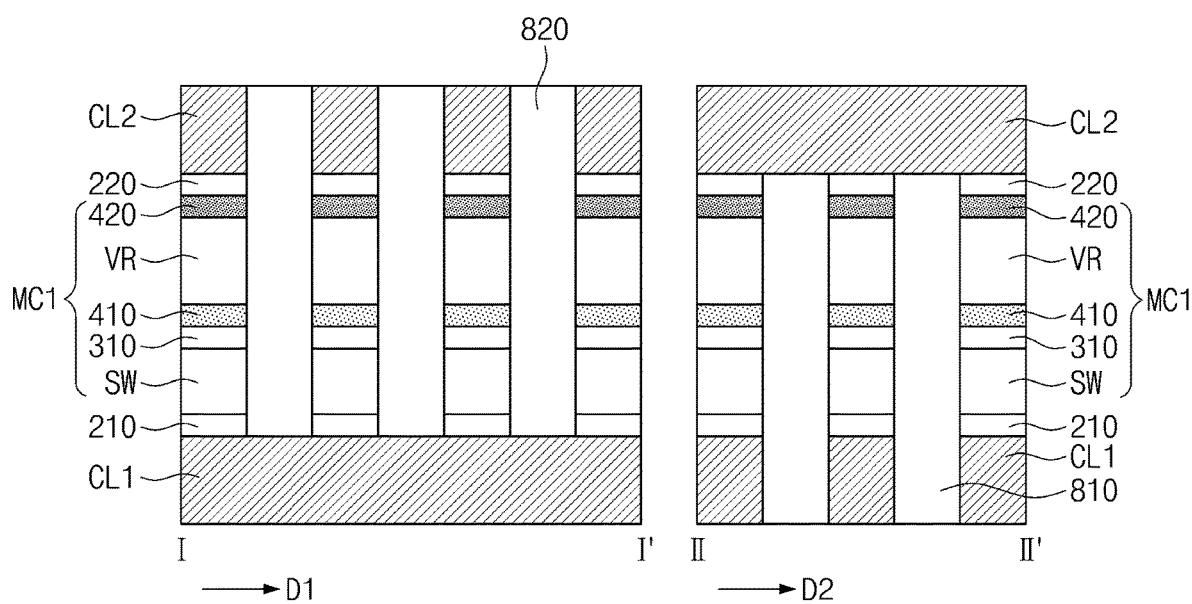

Referring to FIGS. 9A and 9B, after the second patterning process, the second mask M2 may be removed. Thereafter, a second insulating layer 820 may be formed to fill the second trenches T2. A top surface of the second insulating layer 820 and top surfaces of the second conductive lines CL2 may be located on the same plane. Through the processes above, a variable resistance memory device according to some embodiment may be manufactured.

In a method of manufacturing a variable resistance memory device according to some embodiments, the first and second resistivity control patterns 410 and 420 may be formed of different materials from each other. Accordingly, it may be easier to adjust a width of the second resistivity control pattern 420, and also easier to design variable resistance memory devices having various characteristics.

Figure 10A:
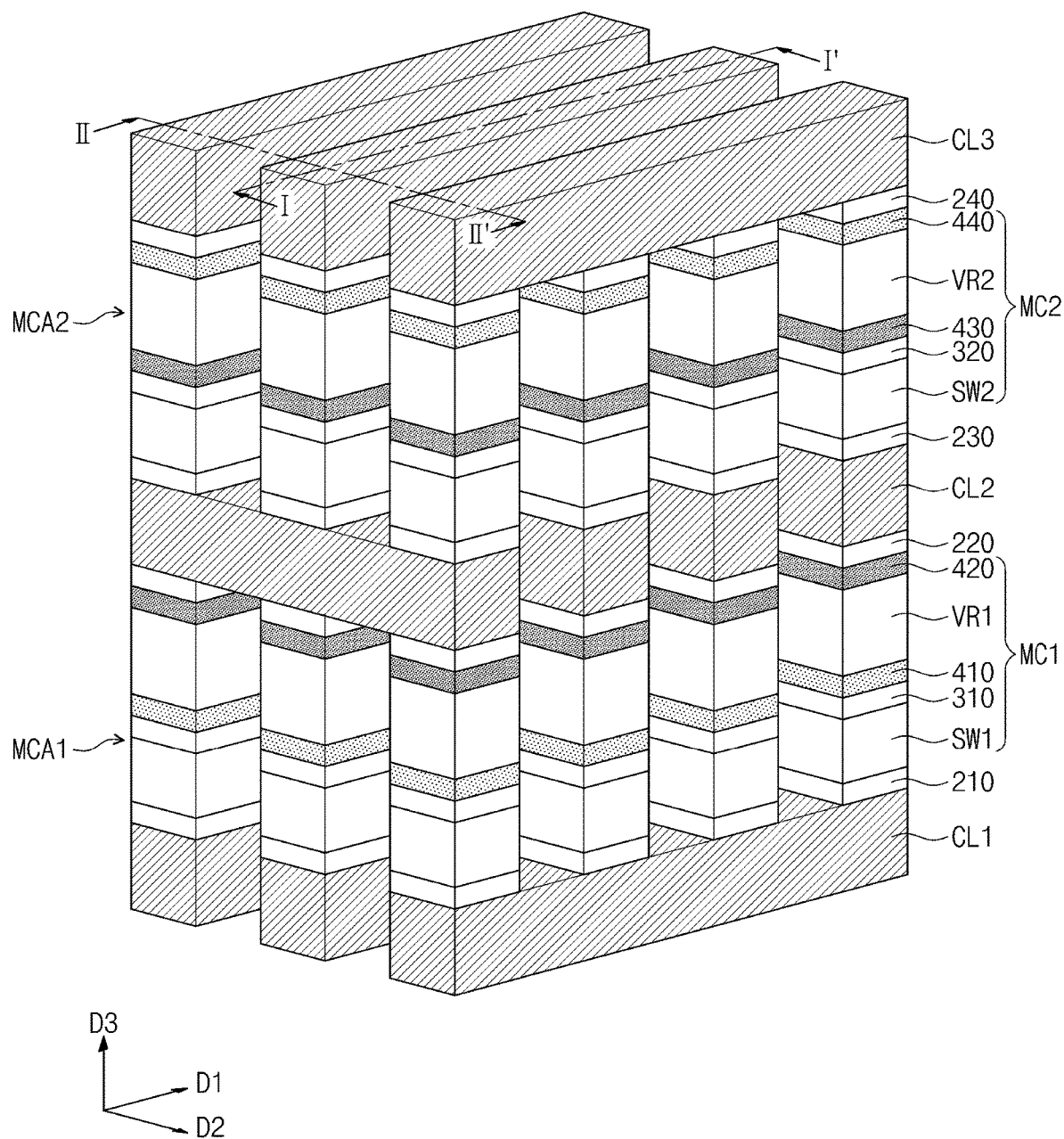
FIG. 10A illustrates a perspective view showing a variable resistance memory device, according to exemplary embodiments.
Figure 10B:
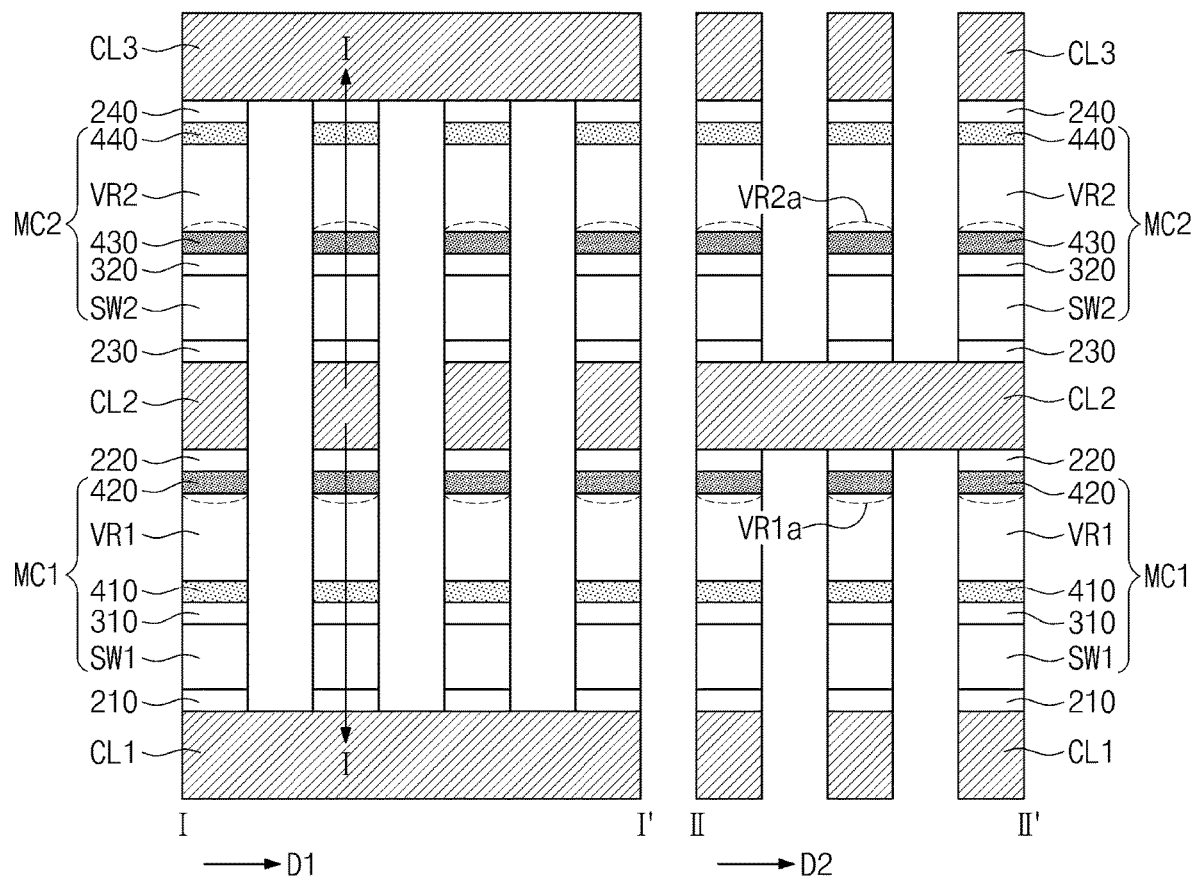
FIG. 10B illustrates a cross-sectional view taken along lines I-I' and II-IF of FIG. 10A.
Figure 10C:
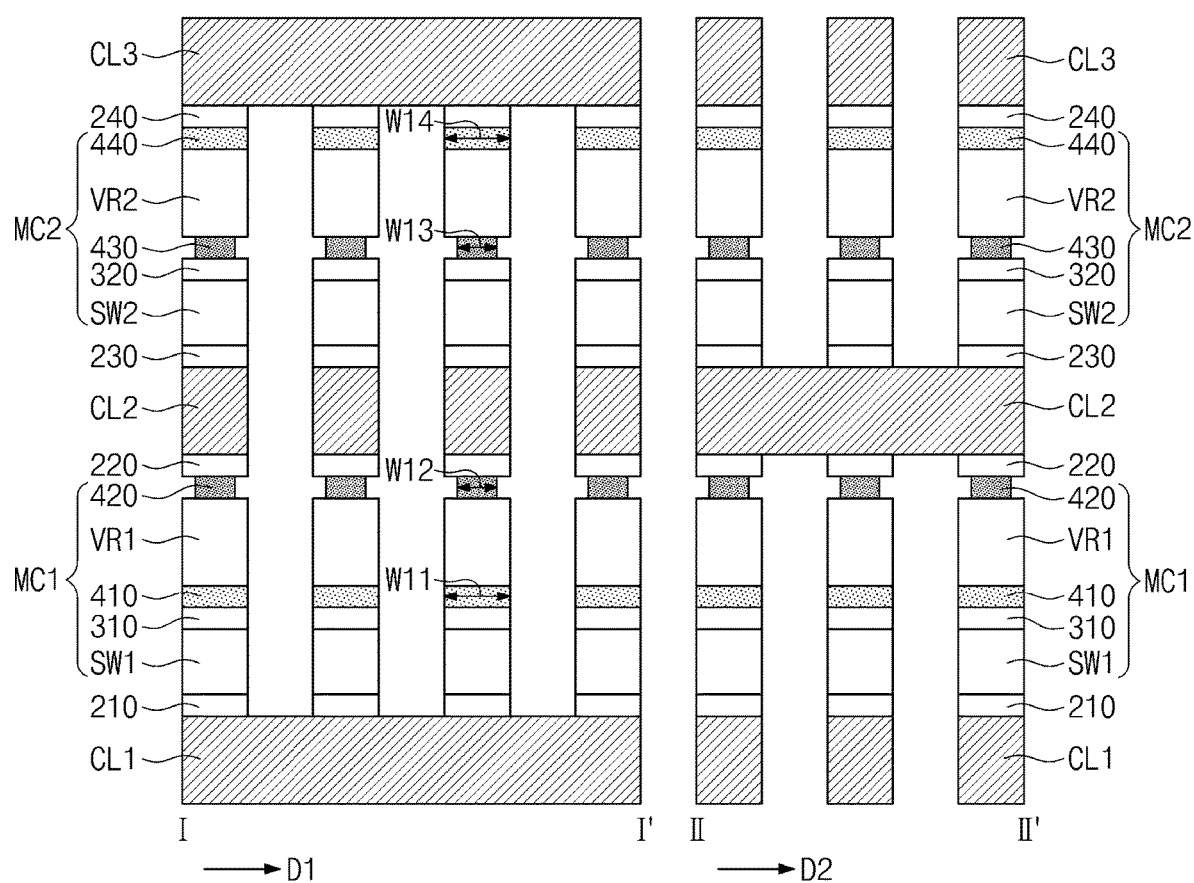
FIGS. 10C and 10D illustrate cross-sectional views showing a variable resistance memory device, according to exemplary embodiments.
Figure 10D:
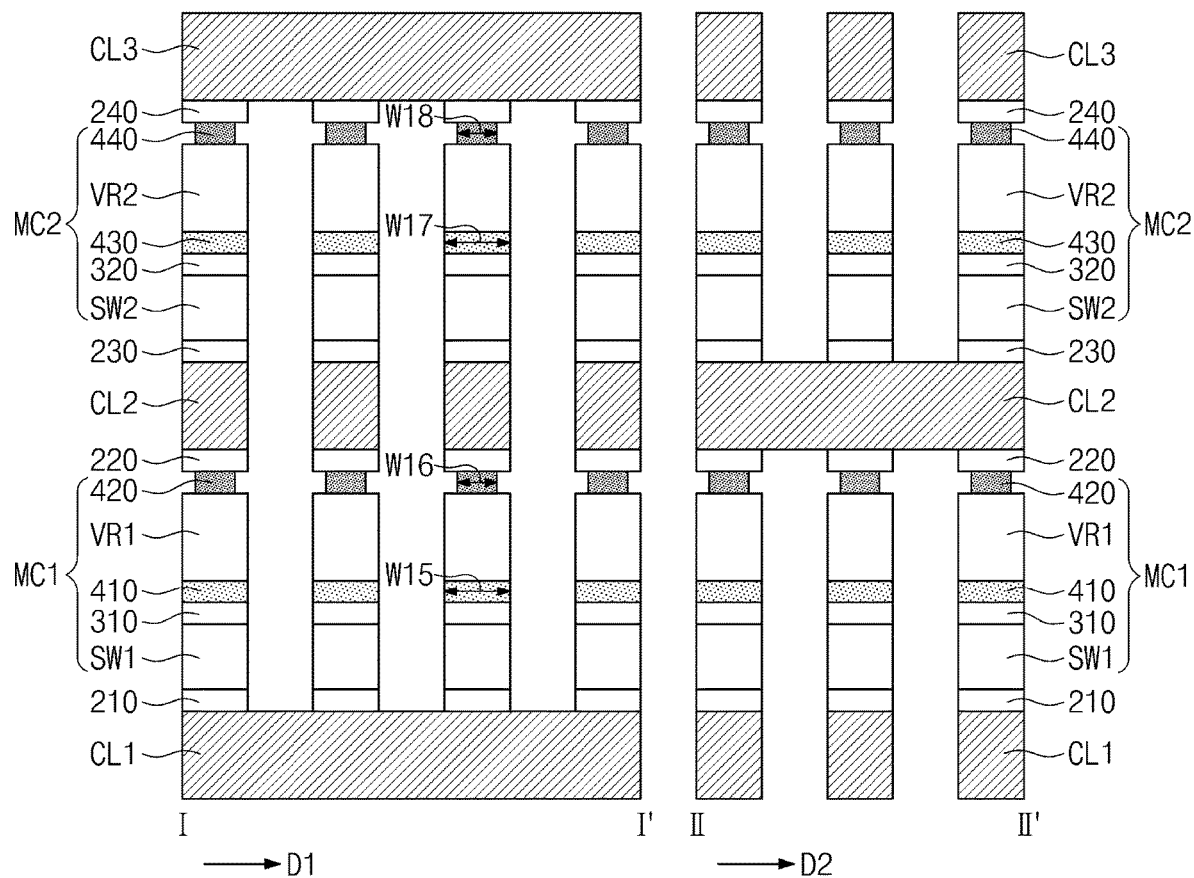

FIG. 10A illustrates a perspective view showing a variable resistance memory device, according to exemplary embodiments. FIG. 10B illustrates a cross-sectional view taken along lines I-I' and II-IF of FIG. 10A. FIGS. 10C and 10D illustrate cross-sectional views showing a variable resistance memory device, according to exemplary embodiments. Components substantially the same as those discussed with reference to FIGS. 2A and 2B are allocated the same reference numerals thereto, and a repetitive description thereof will be omitted. For convenience of description, some components are not shown in FIGS. 10A to 10D.

FIGS. 10A to 10D exemplarily shows two neighboring memory cell stacks MCA1 and MCA2, but the disclosure is not limited thereto.

Referring to FIGS. 10A and 10B, a substrate (not shown) may be provided thereon with first conductive lines CL1, second conductive lines CL2, and third conductive lines CL3. The second conductive lines CL2 may be disposed between the first conductive lines CL1 and the third conductive lines CL3. The first and third conductive lines CL1 and CL3 may extend in a first direction D1. The first and third conductive lines CL1 and CL3 may be word lines. The second conductive lines CL2 may extend in a second direction D2. The second conductive lines CL2 may be bit lines.

First memory cells MC1 may be disposed at intersections between the first conductive lines CL1 and the second conductive lines CL2. The first memory cells MC1 may be electrically connected to the first conductive lines CL1 through first electrodes 210 disposed between the first conductive lines CL1 and the first memory cells MC1, and electrically connected to the second conductive lines CL2 through second electrodes 220 disposed between the first memory cells MC1 and the second conductive lines CL2. Each of the first memory cells MC1 may include a first switching pattern SW1, a first intermediate electrode 310, a first resistivity control pattern 410, a first variable resistance pattern VR1, and a second resistivity control pattern 420 that are connected in series between the first conductive line CL1 and the second conductive line CL2.

The first variable resistance pattern VR1 may be formed of a material capable of storing data. In some embodiments, the first variable resistance pattern VR1 may include a material whose phase can be reversibly changed between a crystalline state and an amorphous state depending on a temperature of the material. The first switching pattern SW1 may be, or may include, a device configured to switch phase based on threshold switching phenomenon having a non-linear I-V curve. For example, the first switching pattern SW1 may be, or may include, an OTS device having bidirectional characteristics. The first switching pattern SW1 and the first variable resistance pattern VR1 may be electrically connected to each other through the first intermediate electrode 310 disposed therebetween.

The first resistivity control pattern 410 may be disposed between the first intermediate electrode 310 and the first variable resistance pattern VR1, and the second resistivity control pattern 420 may be disposed between the first variable resistance pattern VR1 and the second electrode 220. The first resistivity control pattern 410 may be in contact with a bottom surface of the first variable resistance pattern VR1, and the second resistivity control pattern 420 may be in contact with a top surface of the first variable resistance pattern VR1. For example, a top surface of the first resistivity control pattern 410 may physically contact and electrically connect to a bottom surface of the first variable resistance pattern VR1, and a bottom surface of the second resistivity control pattern 420 may physically contact and electrically connect to a top surface of the first variable resistance pattern VR1. The second resistivity control pattern 420 may have resistivity greater than that of the first resistivity control pattern 410. The resistivity of the first resistivity control pattern 410 may be less than that of the second electrode 220.

Second memory cells MC2 may be disposed at intersections between the second conductive lines CL2 and the third conductive lines CL3. The second memory cells MC2 may be electrically connected to the second conductive lines CL2 through third electrodes 230 disposed between the second conductive lines CL2 and the second memory cells MC2, and electrically connected to the third conductive lines CL3 through fourth electrodes 240 disposed between the second memory cells MC2 and the third conductive lines CL3. Each of the second memory cells MC2 may include a second switching pattern SW2, a second intermediate electrode 320, a third resistivity control pattern 430, a second variable resistance pattern VR2, and a fourth resistivity control pattern 440 that are connected in series between the second conductive line CL2 and the third conductive line CL3.

The second variable resistance pattern VR2 may be formed of a material capable of storing data. The second switching pattern SW2 and the second variable resistance pattern VR2 may be electrically connected to each other through the second intermediate electrode 320 disposed therebetween. For example, the second variable resistance pattern VR2 may include the same material as that of the first variable resistance pattern VR1.

The third resistivity control pattern 430 may be disposed between the second intermediate electrode 320 and the second variable resistance pattern VR2, and the fourth resistivity control pattern 440 may be disposed between the second variable resistance pattern VR2 and the fourth electrode 240. The third resistivity control pattern 430 may be in contact with a bottom surface of the second variable resistance pattern VR2, and the fourth resistivity control pattern 440 may be in contact with a top surface of the second variable resistance pattern VR2. For example, a top surface of the third resistivity control pattern 430 may physically contact and electrically connect to a bottom surface of the second variable resistance pattern VR2, and a bottom surface of the fourth resistivity control pattern 440 may physically contact and electrically connect to a top surface of the second variable resistance pattern VR2.

An arrangement of the first resistivity control pattern 410, the first variable resistance pattern VR1, and the second resistivity control pattern 420 and an arrangement of the fourth resistivity control pattern 440, the second variable resistance pattern VR2, and the third resistivity control pattern 430 may be symmetric about the second conductive line CL2. For example, the first and second memory cells MC1 and MC2 may have substantially the same or similar structure. In some embodiments, the first memory cell MC1 may be configured such that the second resistivity control pattern 420 in contact with the top surface of the first variable resistance pattern VR1 has resistivity greater than that of the first resistivity control pattern 410 in contact with the bottom surface of the first variable resistance pattern VR1, whereas the second memory cell MC2 may be configured such that the third resistivity control pattern 430 in contact with the bottom surface of the second variable resistance pattern VR2 has resistivity greater than that of the fourth resistivity control pattern 440 in contact with the top surface of the second variable resistance pattern VR2. For example, the variable resistance patterns VR1 and VR2 may have first sides adjacent to the second conductive line CL2 (also referred to hereinafter as a bit line) and have second sides adjacent to the first and third conductive lines CL1 and CL3 (also referred to hereinafter as word lines), and the second and third resistivity control patterns 420 and 430 on the first sides of the variable resistance patterns VR1 and VR2 may have resistivities greater than those of the first and fourth resistivity control patterns 410 and 440 on the second sides of the variable resistance patterns VR1 and VR2. In some embodiments, resistivity of the second resistivity control pattern 420 is substantially the same as resistivity of the third resistivity control pattern 430, and resistivity of the first resistivity control pattern 410 is substantially the same as resistivity of the fourth resistivity control pattern 440.

Terms such as "same" and "equal," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same" or "substantially equal" may be exactly the same or equal, or may be the same or equal within acceptable variations that may occur, for example, due to manufacturing processes.

In a variable resistance memory device according to some embodiments, an upper portion VR1a of the first variable resistance pattern VR1 may undergo a phase change such that the first memory cell MC1 may operate in a reset mode, and a lower portion VR2a of the second variable resistance pattern VR2 may undergo a phase change such that the second memory cell MC2 may perform a reset operation. The upper portion VR1a may be a concave-shaped portion of the first variable resistance pattern VR1 near the interface between the first variable resistance pattern VR1 and the second resistivity control pattern 420. The lower portion VR2a may be a convex-shaped portion of the second variable resistance pattern VR2 near the interface between the second variable resistance pattern VR2 and the third resistivity control pattern 430.

For example, an electric current I may flow from the second conductive line CL2 toward the first and third conductive lines CL1 and CL3. For the first memory cell MC1, the electric current I may sequentially pass through the second resistivity control pattern 420, the first variable resistance pattern VR1, and the first resistivity control pattern 410, and Joule heating may occur at an interface between the second resistivity control pattern 420 and the first variable resistance pattern VR1. Accordingly, the upper portion VR1a of the first variable resistance pattern VR1 may undergo a phase change, and thus the first memory cell MC1 may perform a reset operation. For the second memory cell MC2, the electric current I may sequentially pass through the third resistivity control pattern 430, the second variable resistance pattern VR2, and the fourth resistivity control pattern 440, and Joule heating may occur at an interface between the third resistivity control pattern 430 and the second variable resistance pattern VR2. Accordingly, the lower portion VR2a of the second variable resistance pattern VR2 may undergo a phase change, and thus the second memory cell MC2 may perform a reset operation.

In some embodiments, an electrical flow in the first memory cell MC1 and an electrical flow in the second memory cell MC2 may be symmetric about the bit line CL2. For example, the electric current I in the first and second memory cells MC1 and MC2 may pass from the bit line CL2 sequentially through the second and third resistivity control patterns 420 and 430 having high resistivities, the first and second variable resistance patterns VR1 and VR2, and the first and fourth resistivity control patterns 410 and 440 having low resistivities, and thus the first and second memory cells MC1 and MC2 may have the same or similar electrical characteristics.

In some embodiments, when variable resistance memory devices are operated, stacked memory cell stacks MCA1 and MCA2 may improve in distribution of electrical characteristics, which may enhance reliability of variable resistance memory devices.

Referring to FIG. 10C, a configuration of the first resistivity control pattern 410, the first variable resistance pattern VR1, and the second resistivity control pattern 420 and a configuration of the fourth resistivity control pattern 440, the second variable resistance pattern VR2, and the third resistivity control pattern 430 may be symmetric about the bit line CL2. When viewed in a plan view, the second resistivity control pattern 420 may have an area less than that of the first resistivity control pattern 410 and/or that of the first variable resistance pattern VR1, and the third resistivity control pattern 430 may have an area less than that of the fourth resistivity control pattern 440 and/or that of the second variable resistance pattern VR2.

The second resistivity control pattern 420 may have a width W12 less than a width W11 of the first resistivity control pattern 410 in the first and second directions D1 and D2. The third resistivity control pattern 430 may have a width W13 less than a width W14 of the fourth resistivity control pattern 440 in the first and second directions D1 and D2. In such a configuration, the first resistivity control pattern 410 may have side surfaces aligned with those of the first variable resistance pattern VR1, and the fourth resistivity control pattern 440 may have side surfaces aligned with those of the second variable resistance pattern VR2.

In some embodiments, a contact area between the bottom surface of the second resistivity control pattern 420 and the top surface of the first variable resistance pattern VR1 may be less than the area of the first variable resistance pattern VR1, and a contact area between the top surface of the third resistivity control pattern 430 and the bottom surface of the second variable resistance pattern VR2 may be less than the area of the second variable resistance pattern VR2. Accordingly, the second resistivity control pattern 420 and the first variable resistance pattern VR1 may have therebetween an interface at which heating occurs and of which the area is small, and likewise the third resistivity control pattern 430 and the second variable resistance pattern VR2 may have therebetween an interface at which heating occurs and of which the area is small. The small areas of the interfaces may reduce power required for the reset operation. As a result, a variable resistance memory device may increase in electrical characteristics.

Referring to FIG. 10D, the first and second memory cell stacks MCA1 and MCA2 may have a repeating structure. A variable resistance memory device may have substantially the same feature as that discussed with reference to FIGS. 10A and 10B, but the fourth resistivity control pattern 440 may have resistivity greater than that of the third resistivity control pattern 430. For example, resistivity of the first resistivity control pattern 410 may be substantially the same as resistivity of the third resistivity control pattern 430, resistivity of the second resistivity control 420 pattern may be substantially the same as resistivity of the fourth resistivity control pattern 440, and the resistivities of the second and fourth resistivity control patterns 420 and 440 may be greater than the resistivities of the first and third resistivity control patterns 410 and 430.

The first, second, third, and fourth resistivity control patterns 410, 420, 430, and 440 and the first and second variable resistance patterns VR1 and VR2 may be repeatedly arranged. For example, the first memory cell MC1 may be configured in such a way that the first resistivity control pattern 410 having low resistivity, the first variable resistance pattern VR1, and the second resistivity control pattern 420 having high resistivity are arranged in a direction from the first conductive line CL1 toward the second conductive line CL2. The second memory cell MC2 may be configured in such a way that the third resistivity control pattern 430 having low resistivity, the second variable resistance pattern VR2, and the fourth resistivity control pattern 440 having high resistivity are arranged in a direction from the second conductive line CL2 toward the third conductive line CL3.

When viewed in a plan view, the second resistivity control pattern 420 may have an area less than that of the first resistivity control pattern 410 and/or that of the first variable resistance pattern VR1, and the fourth resistivity control pattern 440 may have an area less than that of the third resistivity control pattern 430 and/or that of the second variable resistance pattern VR2. The second resistivity control pattern 420 may have a width W16 less than a width W15 of the first resistivity control pattern 410 in the first and second directions D1 and D2. The fourth resistivity control pattern 440 may have a width W18 less than a width W17 of the third resistivity control pattern 430 in the first and second directions D1 and D2. In such a configuration, the first resistivity control pattern 410 may have side surfaces aligned with those of the first variable resistance pattern VR1, and the third resistivity control pattern 430 may have side surfaces aligned with those of the second variable resistance pattern VR2.

According to certain exemplary embodiments, the upper portion of the variable resistance pattern may be locally heated for the phase change of the variable resistance pattern. Accordingly, the variable resistance pattern as a whole may be prevented from being heated, and may be protected from heat-induced damage. As a result, a variable resistance memory device according to exemplary embodiments may increase in operating reliability and stability.

Furthermore, since the second resistivity control pattern and the variable resistance pattern have therebetween an interface at which heating occurs and of which the area is small, it may be possible to reduce power consumption required for the reset operation and to enhance electrical characteristics of variable resistance memory devices.

In a method of manufacturing a variable resistance memory device according to exemplary embodiments, the second resistivity control pattern may be selectively etched to easily adjust a width thereof and to easily design variable resistance memory devices having various characteristics.

According to the exemplary embodiments, when variable resistance memory devices are operated, stacked memory cell stacks may improve in distribution of electrical characteristics, and variable resistance memory devices may increase in reliability.

Although the present invention has been described in connection with the embodiments of inventive concepts illustrated in the accompanying drawings, it will be understood by one of ordinary skill in the art that variations in form and detail may be made therein without departing from the spirit and essential feature of inventive concepts. The above disclosed embodiments should thus be considered illustrative and not restrictive.

What is claimed is:

1. A variable resistance memory device, comprising:
   a first conductive line extending in a first direction;
   a second conductive line extending in a second direction intersecting the first direction;
   a memory cell at an intersection between the first conductive line and the second conductive line;
   a first electrode between the first conductive line and the memory cell; and
   a second electrode between the second conductive line and the memory cell,
   wherein the memory cell comprises a switching pattern, an intermediate electrode, a first resistivity control pattern, and a variable resistance pattern that are connected in series between the first conductive line and the second conductive line, and
   wherein a resistivity of the first resistivity control pattern is less than a resistivity of the second electrode.

2. The device of claim 1, wherein the memory cell further comprises:
   a second resistivity control pattern between the second electrode and the variable resistance pattern,
   wherein a resistivity of the second resistivity control pattern is greater than the resistivity of the first resistivity control pattern.

3. The device of claim 2, wherein the resistivity of the second resistivity control pattern is 10 to 500 times the resistivity of the first resistivity control pattern.

4. The device of claim 2, wherein a width of the first resistivity control pattern and a width of the second resistivity control pattern are different from each other.

5. The device of claim 4, wherein the width of the second resistivity control pattern is less than a width of the variable resistance pattern.

6. The device of claim 4, wherein side surfaces of the first resistivity control pattern are aligned with side surfaces of the variable resistance pattern.

7. The device of claim 2, wherein the second resistivity control pattern contacts the variable resistance pattern.

8. The device of claim 2, wherein, when an electric current flows between the first electrode and the second electrode, heating occurs at an interface between the second resistivity control pattern and the variable resistance pattern.

9. The device of claim 1, wherein a width of the first resistivity control pattern is less than a width of the variable resistance pattern.

10. The device of claim 1, wherein the first resistivity control pattern contacts the intermediate electrode.

11. A variable resistance memory device, comprising:
a first conductive line extending in a first direction;
a second conductive line extending in a second direction perpendicular to the first direction and spaced apart from the first conductive line in a third direction;
a memory cell at an intersection between the first conductive line and the second conductive line;
a first electrode between the first conductive line and the memory cell; and
a second electrode between the second conductive line and the memory cell,
wherein the memory cell comprises, in order, a switching pattern, an intermediate electrode on the switching pattern, a first resistivity control pattern on the intermediate electrode, a variable resistance pattern on the first resistivity control pattern, and a second resistivity control pattern on the variable resistance pattern,
wherein a resistivity of the first resistivity control pattern is less than a resistivity of the second electrode, and
wherein a resistivity of the second resistivity control pattern is greater than the resistivity of the first resistivity control pattern.

12. The device of claim 11, wherein a width of the first resistivity control pattern and a width of the second resistivity control pattern are different from each other.

13. The device of claim 11, wherein a width of the first resistivity control pattern is less than a width of the variable resistance pattern.

14. A variable resistance memory device, comprising:
a first word line and a second word line that extend in a first direction;
a bit line between the first and second word lines and extending in a second direction intersecting the first direction;
a first memory cell at an intersection between the first word line and the bit line; and
a second memory cell at an intersection between the second word line and the bit line,
wherein the first memory cell comprises a first switching pattern, a first intermediate electrode, a first resistivity control pattern, a first variable resistance pattern, and a second resistivity control pattern that are arranged from the first word line to the bit line, and
wherein the second memory cell comprises in the following order: a second switching pattern, a second intermediate electrode, a third resistivity control pattern, a second variable resistance pattern, and a fourth resistivity control pattern that are arranged from the bit line to the second word line.

15. The device of claim 14, wherein resistivity of the second resistivity control pattern is substantially the same as resistivity of the third resistivity control pattern,
wherein resistivity of the first resistivity control pattern is substantially the same as resistivity of the fourth resistivity control pattern, and
wherein the resistivities of the second and third resistivity control patterns are greater than the resistivities of the first and fourth resistivity control patterns.

16. The device of claim 15, wherein widths of the second and third resistivity control patterns are less than widths of the first and second variable resistance patterns.

17. The device of claim 15, wherein, when an electric current flows between the first intermediate electrode and the second intermediate electrode and between the first intermediate electrode and a third intermediate electrode, heating occurs at an interface between the second resistivity control pattern and the first variable resistance pattern and at an interface between the second variable resistance pattern and the third resistivity control pattern.

18. The device of claim 14, wherein resistivity of the first resistivity control pattern is substantially the same as resistivity of the third resistivity control pattern,
wherein resistivity of the second resistivity control pattern is substantially the same as resistivity of the fourth resistivity control pattern, and
wherein the resistivities of the second and fourth resistivity control patterns are greater than the resistivities of the first and third resistivity control patterns.

19. The device of claim 18, wherein widths of the second and fourth resistivity control patterns are less than widths of the first and second variable resistance patterns.

20. The device of claim 18, wherein, when an electric current flows between the first intermediate electrode and the second intermediate electrode and between the first intermediate electrode and a third intermediate electrode, heating occurs at an interface between the second resistivity control pattern and the first variable resistance pattern and at an interface between the second variable resistance pattern and the fourth resistivity control pattern.

* * * * *